(12) United States Patent
Joshi et al.

(10) Patent No.: US 12,040,290 B2
(45) Date of Patent: Jul. 16, 2024

(54) RADIO FREQUENCY INTEGRATED CIRCUIT

(71) Applicant: NATIONAL TSING HUA UNIVERSITY, Hsinchu (TW)

(72) Inventors: Rachit Joshi, Saharanpur (IN); Walter Tony Wohlmuth, Taipei (TW); Shuo-Hung Hsu, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 344 days.

(21) Appl. No.: 17/512,872

(22) Filed: Oct. 28, 2021

(65) Prior Publication Data

US 2023/0140612 A1 May 4, 2023

(51) Int. Cl.
| | |
|---|---|
| *H01L 23/66* | (2006.01) |
| *H01L 23/00* | (2006.01) |
| *H01L 23/64* | (2006.01) |
| *H03H 11/28* | (2006.01) |

(52) U.S. Cl.
CPC ............ *H01L 23/66* (2013.01); *H01L 23/642* (2013.01); *H01L 24/16* (2013.01); *H01L 24/48* (2013.01); *H01L 24/73* (2013.01); *H03H 11/28* (2013.01); *H01L 2223/6627* (2013.01); *H01L 2223/6655* (2013.01); *H01L 2223/6677* (2013.01); *H01L 2223/6683* (2013.01); *H01L 2224/16227* (2013.01); *H01L 2224/48227* (2013.01); *H01L 2224/73257* (2013.01); *H01L 2924/014* (2013.01)

(58) Field of Classification Search
CPC ....... H01L 23/66; H01L 23/642; H01L 24/16; H01L 24/48
USPC ........................................................ 257/728
See application file for complete search history.

(56) References Cited

U.S. PATENT DOCUMENTS

| | | | | |
|---|---|---|---|---|
| 5,696,466 | A * | 12/1997 | Li ........................... H01L 23/66 330/307 |
| 11,343,919 | B2 * | 5/2022 | Santos ................... H03F 1/0288 |
| 2008/0116588 | A1 * | 5/2008 | Van Kleef ............ H05K 3/3452 257/E23.06 |
| 2023/0115340 | A1 * | 4/2023 | Wei ................... H01L 23/49811 257/676 |

* cited by examiner

*Primary Examiner* — Jasmine J Clark
(74) *Attorney, Agent, or Firm* — Rosenberg, Klein & Lee

(57) ABSTRACT

A radio frequency integrated circuit comprising: at least one transistor; a matching circuit coupled to said transistor; and at least one bump is used to form a passive element in said matching circuit, and said bump is used for radio frequency matching, the bumps can be used as passive components for amplifier harmonic impedance matching or the bumps can be the amplifier's passive components of the harmonic impedance matching, both of them can enhance the power, bandwidth and efficiency of amplifiers and integrated circuits.

42 Claims, 26 Drawing Sheets

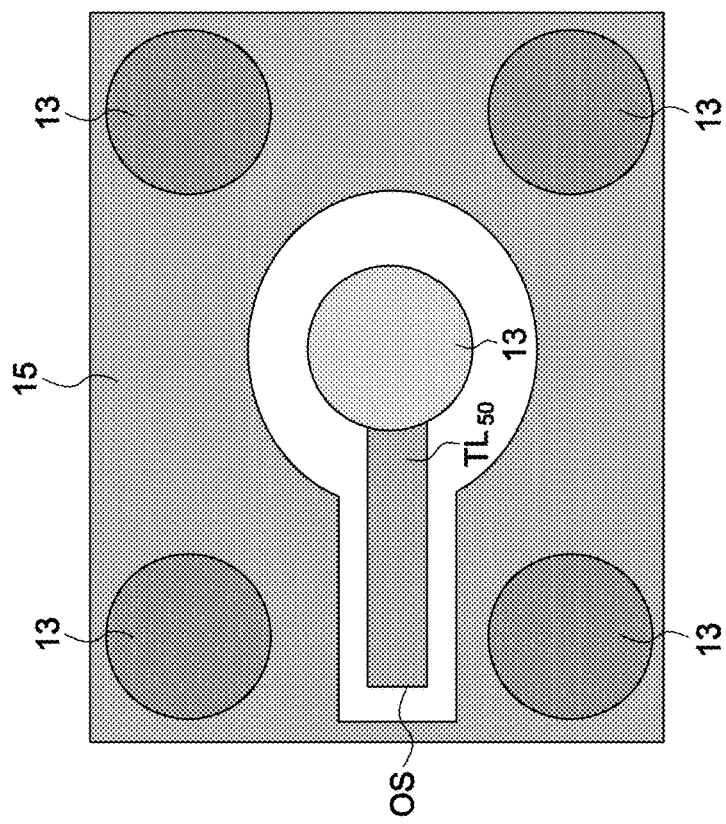
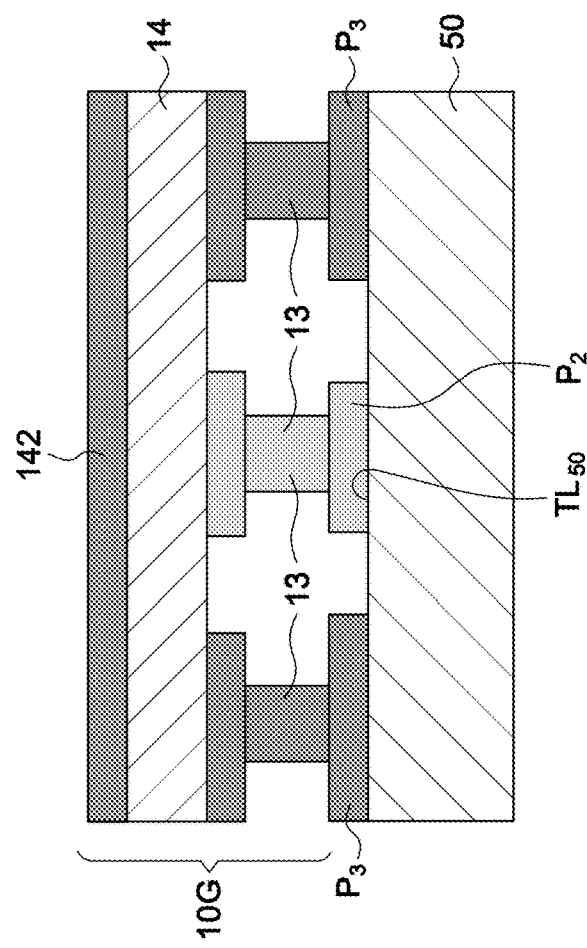
FIG.11B
FIG.11A

RADIO FREQUENCY INTEGRATED CIRCUIT

BACKGROUND OF THE INVENTION

1. Field of the Invention

The present invention relates to a radio frequency integrated circuit that using a bump as a part of the impedance matching network, using the bump as part of the electronic components of the impedance matching network.

2. Description of the Related Art

The thickness of the substrate is ground to 50 µm~100 µm, which will have a six-sigma variation of ±10%. The variation of the thickness of the substrate leads to the problem of parasitic inductance variation, which is the subject of the present invention.

SUMMARY OF THE INVENTION

A primary objective of the present invention is to provide a radio frequency integrated circuit that uses a bump as passive components for matching the amplifier harmonic impedance, so as to reduce signal reflections in high-frequency circuit applications.

Another objective of the present invention is to provide a radio frequency integrated circuit using a bump to design novel circuits, thereby increasing the bandwidth and efficiency of the amplifier, and reducing the chip area of the amplifier to reduce the cost.

To achieve the objective mentioned above, the present invention comprises: at least one transistor; a matching circuit coupled to said transistor; and at least one bump used to form a passive element in said matching circuit, and said bump is used for radio frequency matching.

Also, said radio frequency matching is harmonic matching, fundamental matching, or a combination thereof.

Also, said radio frequency integrated circuit is a monolithic microwave integrated circuit or hybrid integrated circuit.

Also, said matching circuit includes a harmonic matching circuit, said harmonic matching circuit has an input harmonic matching circuit, an output harmonic matching circuit, or a combination thereof.

Also, said harmonic matching circuit matches the impedance of the transistor at the second harmonic frequency, matches the impedance of the transistor at the third harmonic frequency or a combination thereof.

Also, said harmonic matching circuits includes a harmonic terminating network composed of a shunt L-C network where inductor and capacitor are in series, and said inductor includes inductance of said bump.

Also, said bump is composed of a eutectic combination of materials, lead free materials, high lead materials, solder materials, copper-containing materials, or combination thereof.

Also, said bump may be a pillar.

Also, further includes a conductor, said conductor is arranged at a predetermined position in said radio frequency integrated circuit, so that said conductor and said bump are used together.

Also, said conductor is a wire bond or wedge bond.

Also, further includes a substrate, said substrate is connected to said bump, and said substrate is a printed circuit board, laminate, interposer, or a combination thereof.

Also, further includes a substrate, said substrate is connected to said matching circuit by said bump.

Also, said capacitance of said L-C network of claim 6 is formed partly or entirely on said substrate.

Also, said substrate is a printed circuit board, laminate, interposer, or a combination thereof.

Also, further includes a redistribution layer, and said bump is connected to said matching circuit through said redistribution layer.

Also, further includes an antenna and a bottom substrate, and said antenna is arranged on said bottom substrate, and said radio frequency integrated circuit is arranged on said bottom substrate, so that said radio frequency integrated circuit is connected to said antenna.

Also, wherein said bottom substrate upon which said antenna is arranged is Silicon, Silicon-on-insulator, ceramic, glass, laminate, printed circuit board, interposer, or combination thereof.

Also, said radio frequency integrated circuit and said antenna together form an antenna-in-package product.

Also, said radio frequency integrated circuit has an operating frequency from 3 GHz to 300 GHz.

Also, includes a transmission line, said transmission line is connected to said bump.

Also, said transmission line is a coplanar waveguide, a grounded coplanar waveguide, microstrip line, a stripline, or a combination thereof.

Also, further includes a transmission line is formed on a bottom substrate.

Also, further includes a substrate and a transmission line, and said transmission line is terminated in an open stub or ungrounded bump.

Also, further includes a top and bottom substrate, and said substrate having a substrate via, and the backside of said substrate having a backside metal, so that said bottom substrate is connected to said backside metal through said substrate via, and said top substrate is connected to said bump.

Also, said radio frequency integrated circuit is a stacked die connected to said bottom substrate and said top substrate.

Also, further includes an ungrounded via, and said ungrounded via is connected to said substrate via.

Also, wherein said bump is in series with a shunt transmission line.

Also, further includes a substrate, said substrate having an ungrounded substrate via.

Also, further includes an antenna and a bottom substrate, said bottom substrate upon which said antenna is arranged is Silicon, Silicon-on-insulator, ceramic, glass, laminate, printed circuit board, interposer, or combination thereof.

Also, said bump, said shunt transmission line, said ungrounded substrate via, or a combination thereof, can be connected together with a capacitor in series to form a shunt L-C resonator, said shunt L-C resonator in conjunction with the parasitic output capacitance of said transistor with different compensation networks, works as a harmonic matching network for switch mode power amplifiers.

Also, said shunt L-C resonator branch can be connected to the input of the transistor for input harmonic termination, the output of the transistor for output harmonic terminations, or a combination thereof, for linear power amplifiers.

Also, said shunt L-C resonator is formed in part or fully by using a metal-insulator-metal capacitor as said capacitor on an ungrounded via or said ungrounded substrate via.

Also, said metal-insulator-metal capacitor and an ungrounded via or said ungrounded substrate via have a common metal layer.

Also, said common metal layer may form the backside metal of said substrate connection to said ungrounded via or said ungrounded substrate via and the bottom plate of said metal-insulator-metal capacitor.

Also, said shunt L-C resonator can be formed partly or fully by using an open stub transmission line as said capacitor with said shunt transmission line, said bump or said ungrounded substrate via acting as an inductor.

Also, said shunt L-C resonator can be formed in part or fully by using a voltage-tunable variable capacitor as said capacitor and said capacitor dielectric material is formed in part or fully by Barium Strontium Titanate, Tantalum Pentoxide, Hafnium Oxide, Aluminum Oxide, or a combination thereof.

Also, said capacitance of said shunt L-C resonator can be formed in part or fully by using a bond pad as a metal-insulator-metal capacitor or under bump, said bond pad and said bump have a common metal layer.

Also, said common metal layer may form an under bump metal of said bump and the top plate of said metal-insulator-metal capacitor.

Also, said metal-insulator-metal capacitance can be formed by a parallel plate capacitor, an interdigitated capacitor, a metal cross-over, or a combination thereof.

Also, said shunt L-C resonator could be part of any switch-mode power amplifiers like class C, E, F, inverse F or S amplifiers or could be used in any linear amplifiers like class A, AB, B or C amplifiers.

Also, said harmonic matching network for class F topology comprises of said shunt L-C harmonic terminating network, a shunt compensating network composed of a shunt inductor and a shunt capacitor of lumped low-pass it-type shunt quarter-wave transmission line and device output parasitic capacitance, using the second and third harmonic frequencies of the fundamental frequency.

Also, the values of the inductance L and capacitance C for class F harmonic matching network using second and third harmonics can be calculated using equations in Formula 1~Formula 4:

$$C = \frac{1}{4L_{total}\omega_0^2} \quad \text{(Formula 1)}$$

$$L = \frac{9L_B}{45L_B[C_{DS} + C_0]\omega_0^2 - 5} \quad \text{(Formula 2)}$$

$$L = L_{BUMP} + L_{ADD} \quad \text{(Formula 3)}$$

$$L_B = \frac{Z_0}{\omega_0^1}; C_0 = \frac{1}{Z_0\omega_0^1} \quad \text{(Formula 4)}$$

where, $L_{BUMP}$ is the inductance of the bump,

L and C are the inductance and capacitance of the shunt L-C resonator, $L_{ADD}$ is the extra inductance an as per need basis for required inductance L and can be formed from the ungrounded substrate via or shunt transmission line or various combinations thereof, $w_o$ is the RF fundamental angular frequency, $L_B$ and $C_O$ are the shunt inductance and shunt capacitance of the compensating network, $Z_0$ is the characteristic impedance of the shunt low-pass it-type quarter wave transmission line acting as a compensating network, $C_{DS}$ is the device parasitic output capacitance.

Also, said bump can be a single bump or multiple bumps connected in parallel.

Also, said bump is a solder bump formed of Ti/NiV/Ag, a micro-bump, a hybrid bump, or combination thereof.

Also, said bump is a flip chip bump formed of Ti/TiW/Cu/AuSn.

With the features disclosed above, the thickness of the bumps can be adjusted or the solder bumps can be adjusted, to have more accurate impedance matching, therefore, the bumps can be used as passive components for amplifier harmonic impedance matching or the bumps can be the amplifier's passive components of the harmonic impedance terminal, both of them can enhance the power, bandwidth and efficiency of amplifiers and integrated circuits.

BRIEF DESCRIPTION OF THE DRAWINGS

FIG. 11A is a schematic diagram of the seventh embodiment of said radio frequency integrated circuit.

FIG. 11B is a schematic diagram in top view of the bump connecting to the transmission line of the seventh embodiment of said radio frequency integrated circuit.

DETAILED DESCRIPTION OF THE PREFERRED EMBODIMENT

Referring to FIGS. 1~20F, the radio frequency integrated circuit 10A~10N of the present invention comprises: at least one transistor 11; a matching circuit 12 coupled to said transistor 11; and at least one bump 13 is used to form a passive element in said matching circuit, and said bump 13 is used for radio frequency matching, in this embodiment, said radio frequency matching is harmonic matching, fundamental matching, or a combination thereof; said radio frequency integrated circuit 10 is a monolithic microwave integrated circuit or hybrid integrated circuit; said radio frequency integrated circuit 10 has an operating frequency range from 3 GHz to 300 GHz, but the present invention is not limited to this range.

Figure 1:
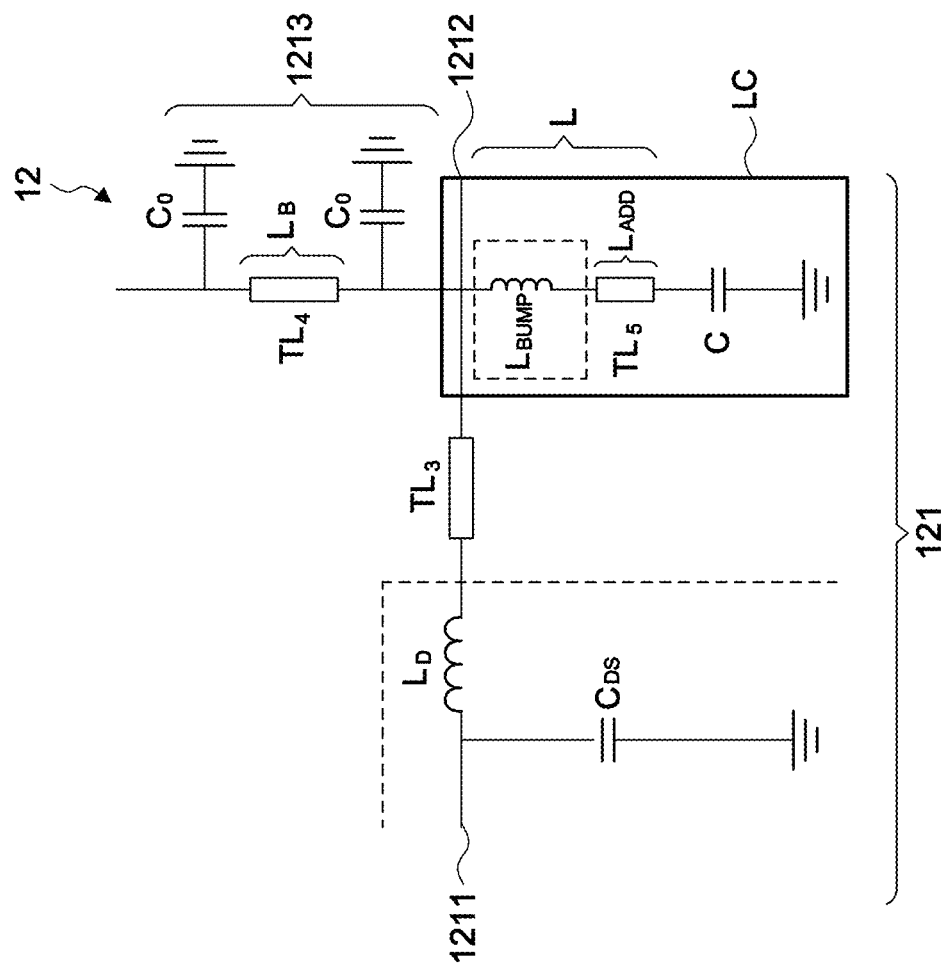
FIG. 1 is a schematic diagram of the harmonic matching circuit of the present invention.
Figure 2:
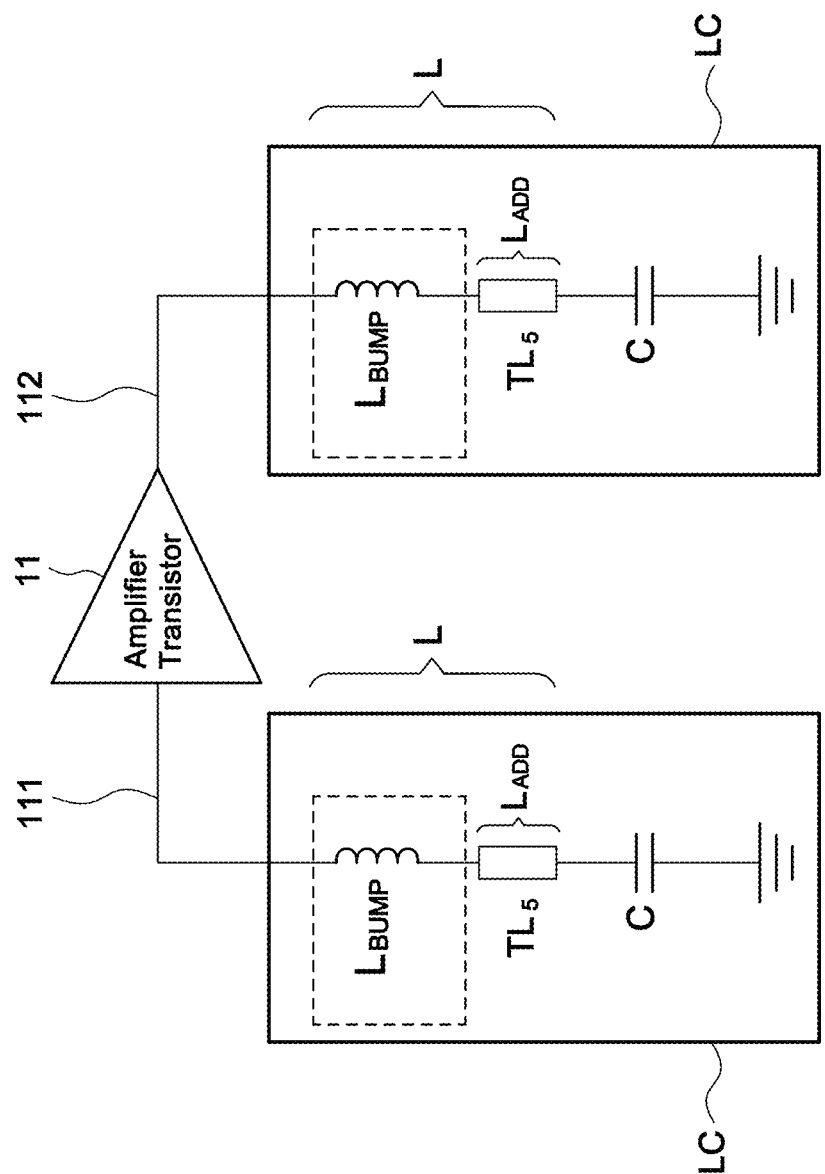
FIG. 2 is a schematic diagram of the harmonic matching impedance for the transistor of the present invention.
Figure 3:
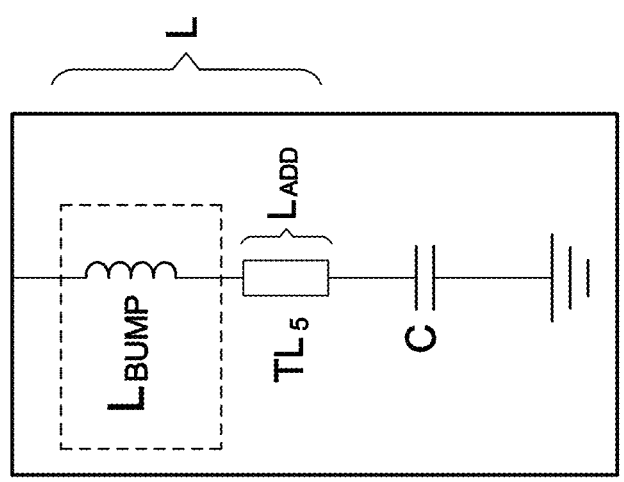
FIG. 3 is a schematic diagram of the harmonic terminating network composed of a shunt L-C network where inductor and capacitance are in series of the present invention.

Referring to FIGS. 1~3, said matching circuit 12 includes a harmonic matching circuit 121, said harmonic matching circuit 121 has is an input harmonic matching circuit 1211, an output harmonic matching circuit 1212, or a combination thereof; in this embodiment, said harmonic matching circuit 121 matches the impedance of the transistor 11 at the second harmonic frequency, matches the impedance of the transistor 11 at the third harmonic frequency or a combination thereof, and said harmonic matching circuits 121 includes a harmonic terminating network LC composed of a shunt L-C network where inductor L and capacitance C are in series, and said inductor L includes inductance $L_{bump}$ of said bump; said shunt L-C resonator branch can be connected to the input of the transistor 11 for input harmonic termination 111, the output of the transistor 11 for output harmonic terminations 112, or a combination thereof, for linear power amplifiers, but the present invention is not limited to this application.

Figure 4B:
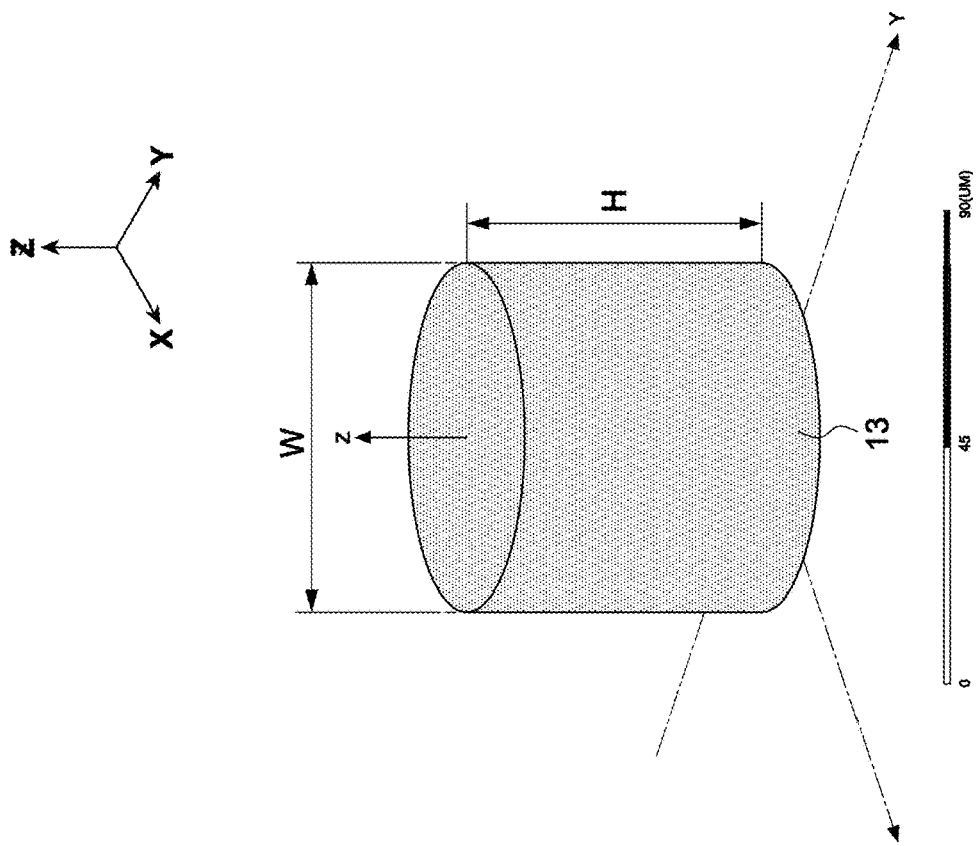
FIG. 4B is another schematic diagram of a 60 µm high and 70 µm wide bump of the present invention.
Figure 4A:
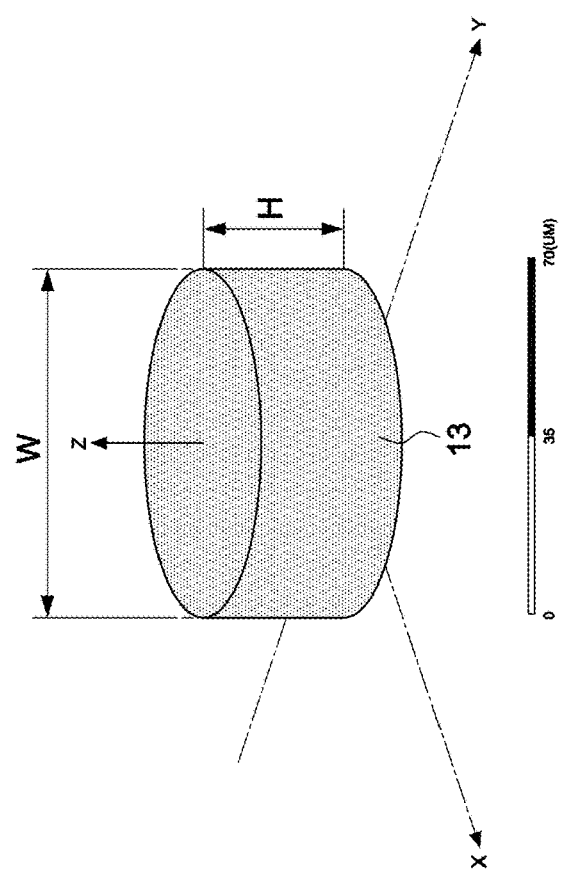
FIG. 4A is a schematic diagram of a 30 µm high and 70 µm wide bump of the present invention.

Also, said bump 13 is composed of a eutectic combination of materials, lead free materials, high lead materials, solder materials, copper-containing materials, or combination thereof, said bump 13 is a solder bump formed of Ti/NiV/Ag, a micro-bump, a hybrid bump, or combination thereof, or said bump 13 is a flip chip bump formed of Ti/TiW/Cu/AuSn; said bump 13 may be a pillar, said bump 13 can be a single bump or multiple bumps connected in parallel, as FIG. 4A showing, the width W of said bump 13 is 70 μm, the height H of said bump 13 is 30 μm, as FIG. 4B showing, the width W of said bump 13 is 70 μm, the height H of said bump 13 is 60 μm, but the present invention is not limited to this application.

Referring to FIG. 5, FIG. 6A, FIG. 6B, FIG. 7, FIG. 8, FIG. 9, FIG. 10, are the first embodiment to the sixth embodiment of the radio frequency integrated circuit 10A, 10B, 10C, 10D, 10E, and 10F, includes a conductor 20, said conductor 20 is arranged at a predetermined position of said radio frequency integrated circuit 10, so that said conductor 20 and said bump 13 are used together, and further includes a substrate 14, said substrate 14 is connected to said bump 13, said substrate 14 is connected to said matching circuit 121 by said bump 13; in this embodiment, said substrate 14 is a printed circuit board, laminate, interposer, or a combination thereof, and said conductor 20 is a wire bond or wedge bond; said capacitance C of said L-C network LC is formed partly or entirely on said substrate 14, but the present invention is not limited to this application.

Figure 5:
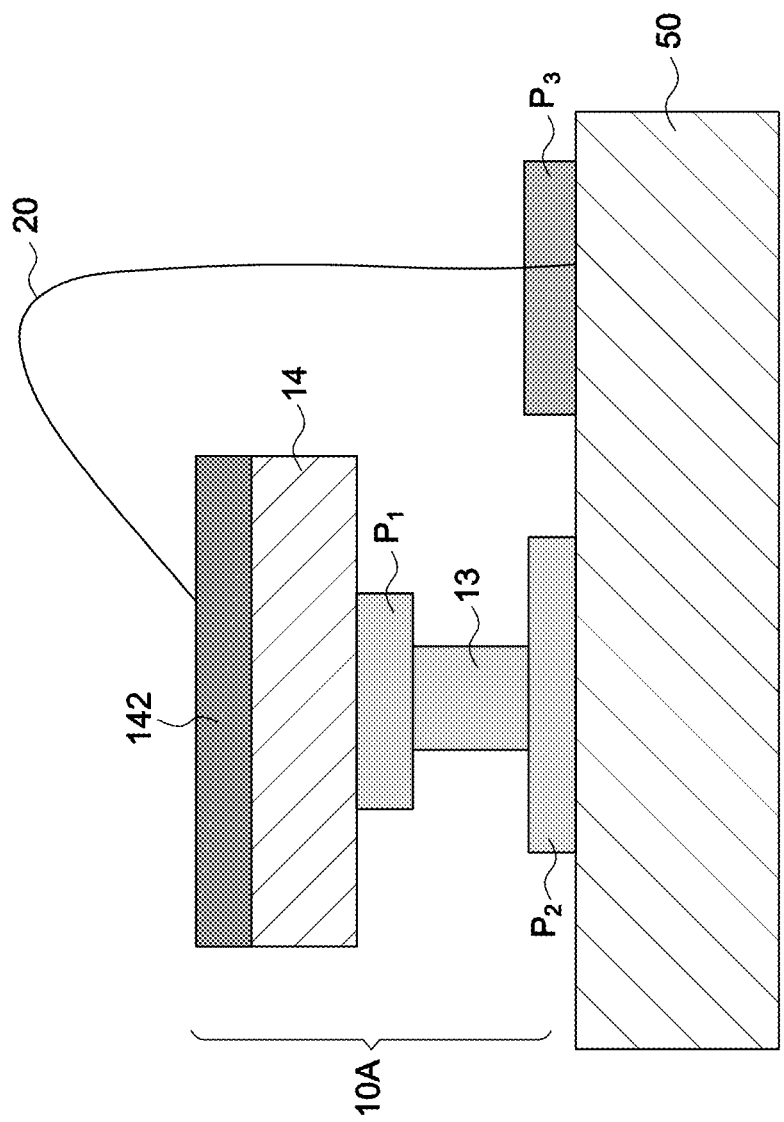
FIG. 5 is a schematic diagram of the first embodiment of said radio frequency integrated circuit.
Figure 6B:
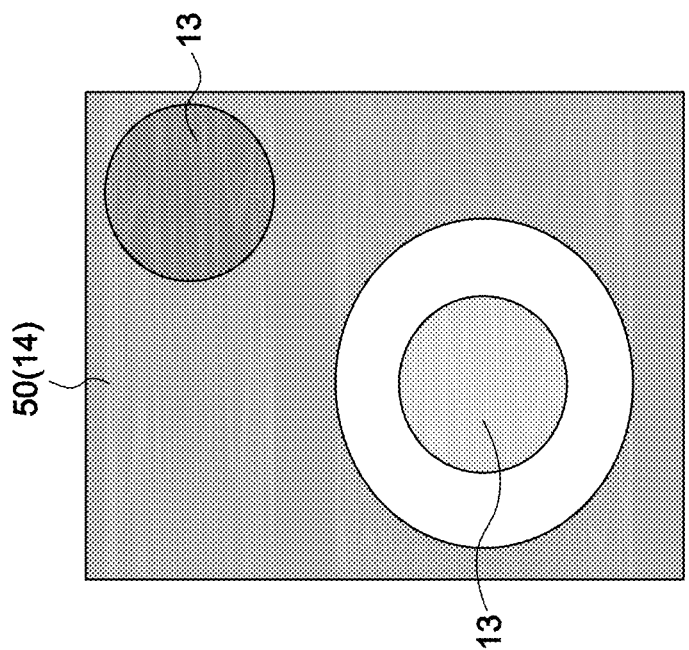
FIG. 6B is a schematic diagram in top view of the second embodiment of different bump of said radio frequency integrated circuit.
Figure 6A:
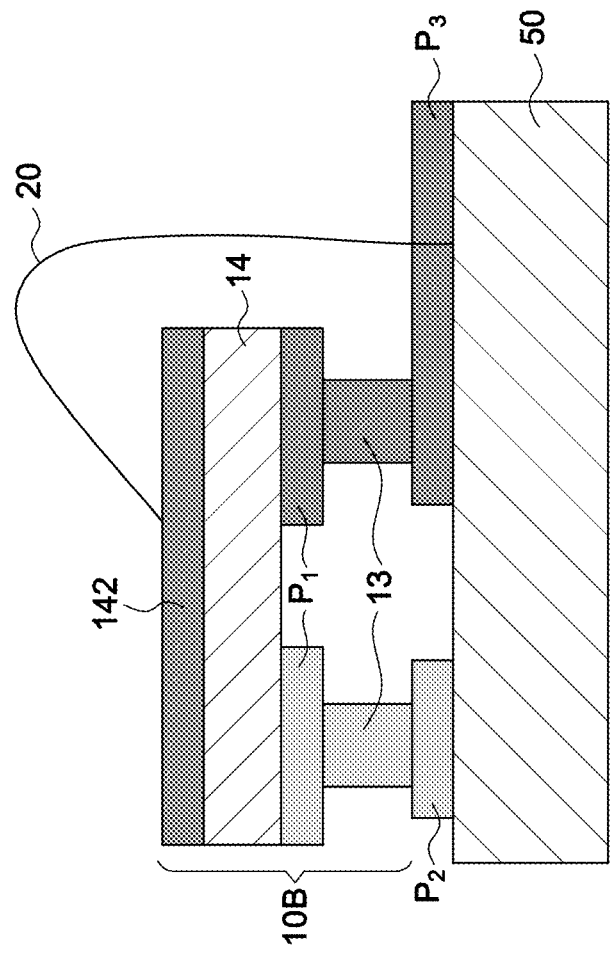
FIG. 6A is a schematic diagram of the second embodiment of said radio frequency integrated circuit.

Referring to FIG. 5, which is the first embodiment of the radio frequency integrated circuit 10A, said substrate 14 has a backside metal 142 on the back and a contact pad $P_1$ on the front. It can also include a bottom substrate 50. The bottom substrate 50 has an ungrounded contact pad $P_2$ and a grounded contact pad $P_3$, and the bump 13 is connected between the contact pad $P_1$ and the ungrounded contact pad $P_2$, so that the bump 13 is an ungrounded bump. In this embodiment, the bottom substrate 50 is Silicon, Silicon-on-insulator, ceramic, glass, laminate, printed circuit board, interposer, or combination thereof; further referring to FIGS. 6A and 6B, which is the second embodiment of the frequency integrated circuit 10B, said bump 13 is connected between the contact pad $P_1$ and the grounded contact pad $P_3$, so that said bump 13 is a ground bump, but the present invention is not limited to this application.

Figure 7:
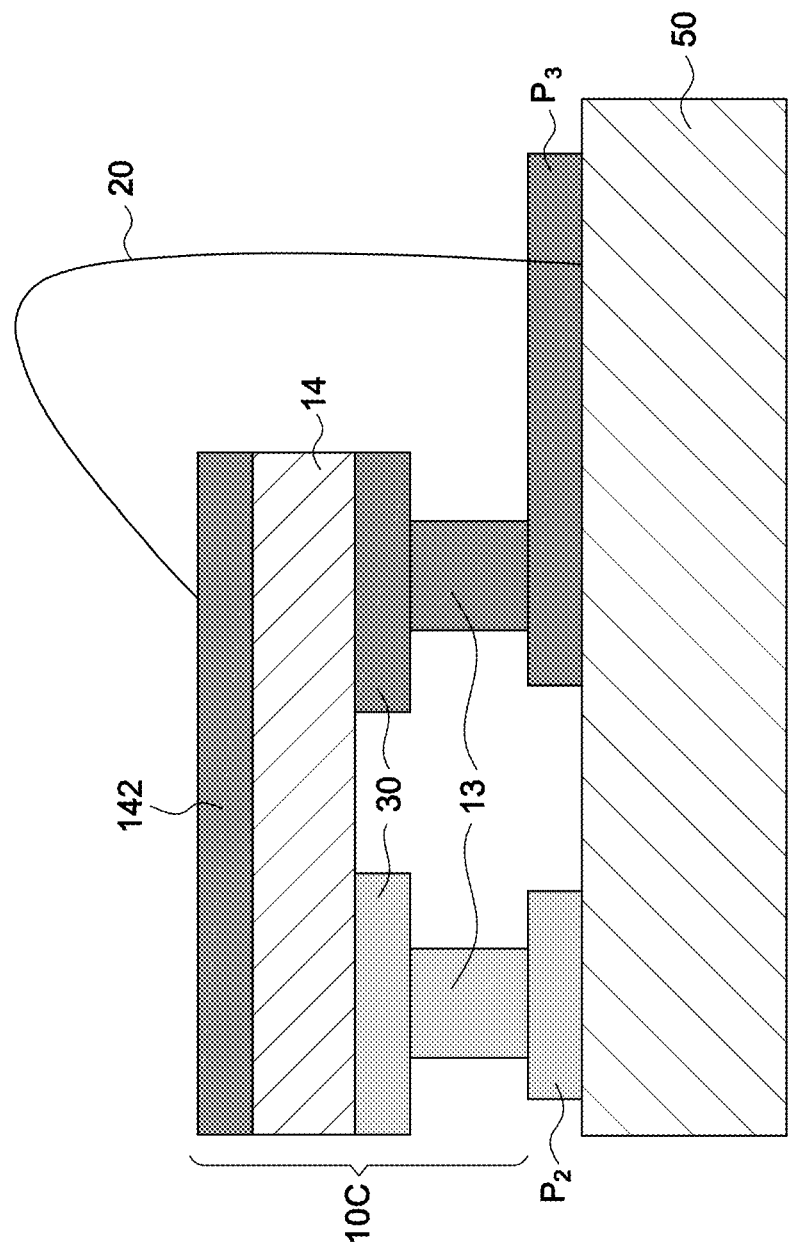
FIG. 7 is a schematic diagram of the third embodiment of said radio frequency integrated circuit.

Referring to FIG. 7, which is the third embodiment of the radio frequency integrated circuit 10C, includes a redistribution layer 30, and said bump 13 is connected to said matching circuit 12 through said redistribution layer 30. The difference from the radio frequency integrated circuit 10B of the second embodiment is that the contact pad $P_1$ is different from the redistribution layer 30, and the bump 13 is connected between the redistribution layer 30 and the ground contact pad $P_3$, but the present invention is not limited to this application.

Figure 8:
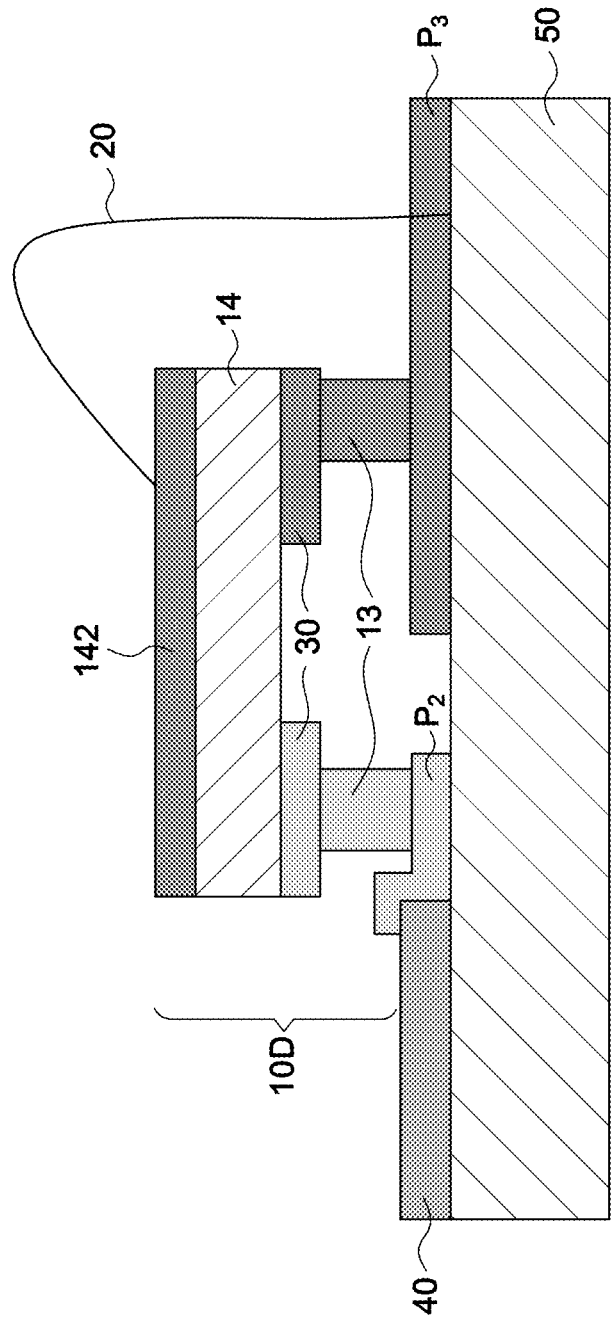
FIG. 8 is a schematic diagram of the fourth embodiment of said radio frequency integrated circuit.

Referring to FIG. 8, which is the fourth embodiment of the frequency integrated circuit 10D, further includes an antenna 40 and a bottom substrate 50, and said antenna 40 is arranged on said bottom substrate 50, and said radio frequency integrated circuit 10D is arranged on said bottom substrate 50, so that said radio frequency integrated circuit 10D is connected to said antenna 40. The difference from the radio frequency integrated circuit 10C of the third embodiment is that addition of an antenna 40, but the present invention is not limited to this application.

Figure 9:
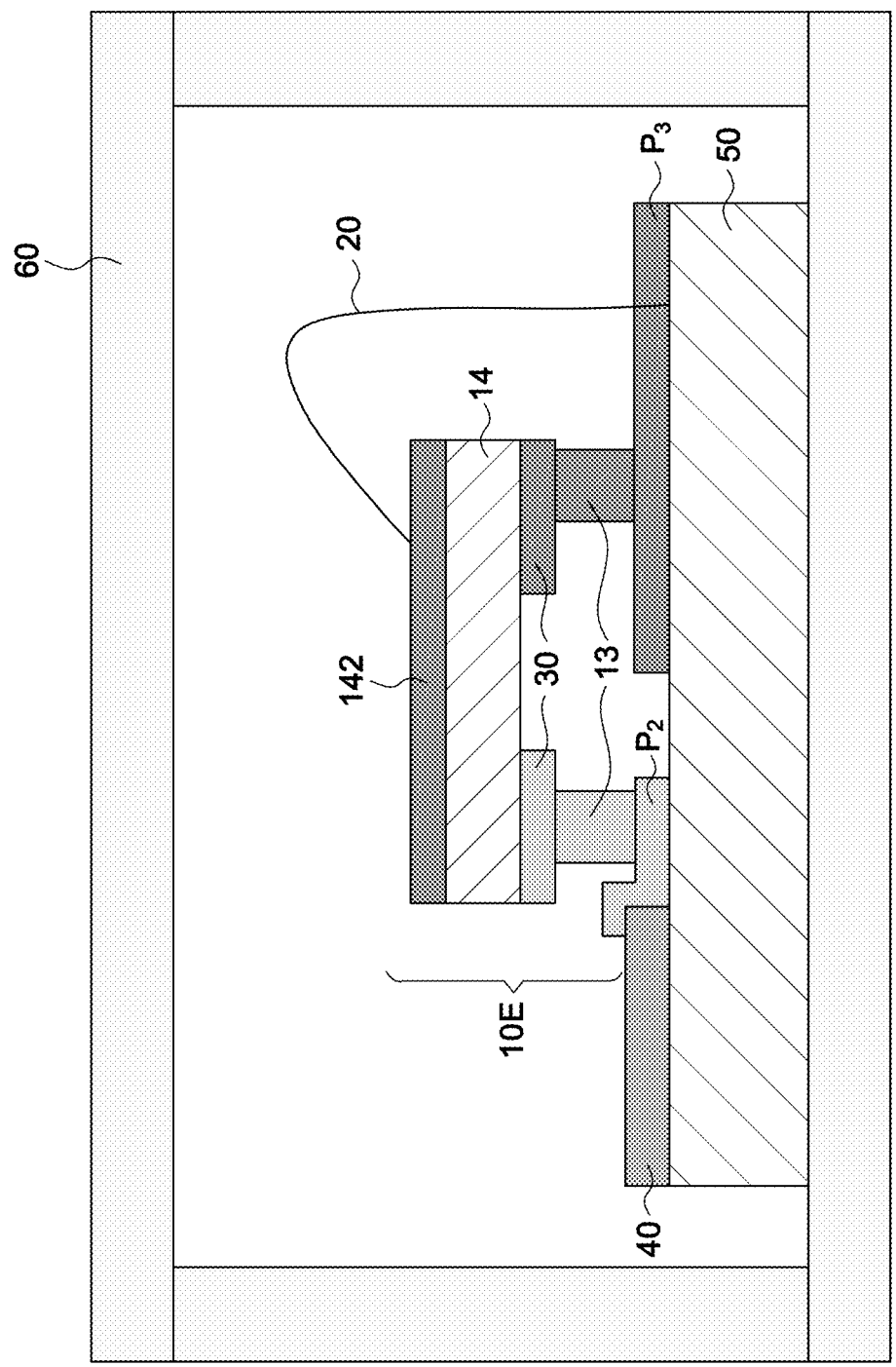
FIG. 9 is a schematic diagram of the fifth embodiment of said radio frequency integrated circuit.

Referring to FIG. 9, which is the fifth embodiment of the frequency integrated circuit 10E, said radio frequency integrated circuit 10E and said antenna 40 together form an antenna-in-package product 60. The difference from the frequency integrated circuit 10D of the fourth embodiment is the package, but the present invention is not limited to this application.

Figure 10:
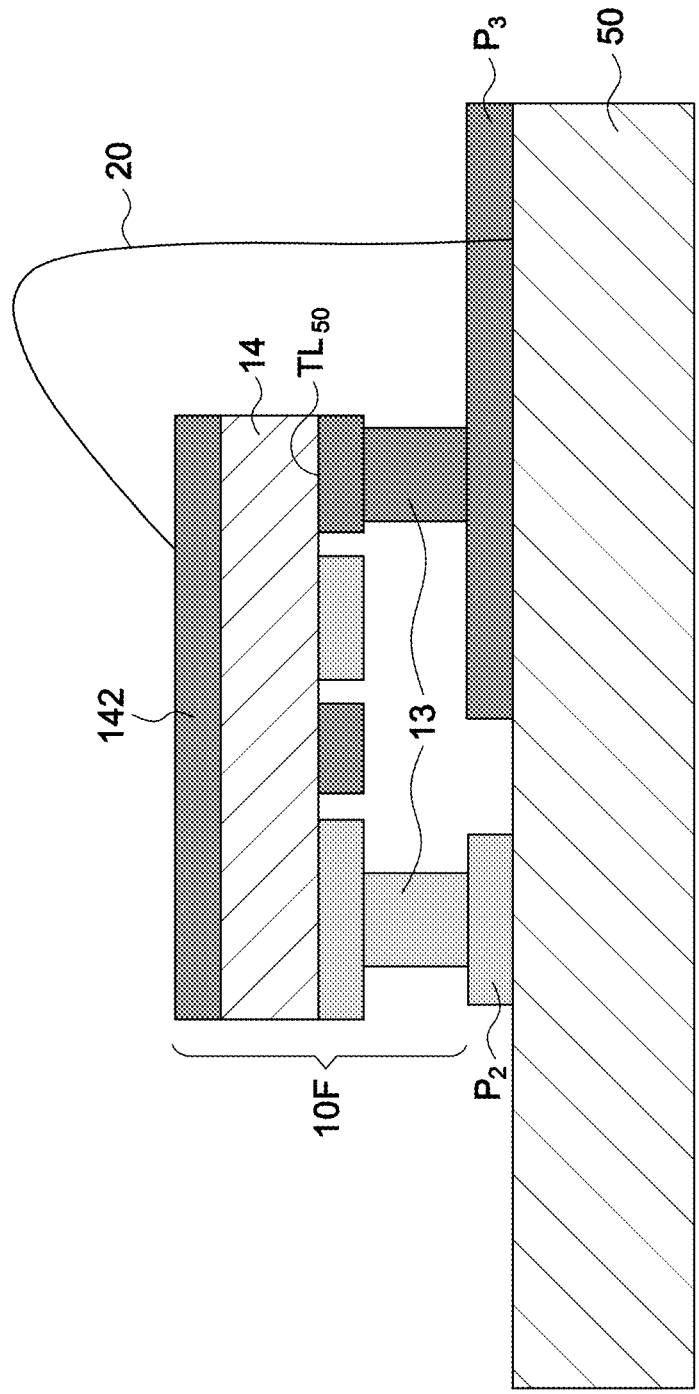
FIG. 10 is a schematic diagram of the sixth embodiment of said radio frequency integrated circuit.

Referring to FIG. 10, which is the sixth embodiment of the radio frequency integrated circuit 10F, further includes a transmission line $TL_{50}$, said transmission line $TL_{50}$ is connected to said bump 13. In this embodiment, said transmission line $TL_{50}$ is a coplanar waveguide, a grounded coplanar waveguide, a microstrip line, a stripline, or a combination thereof. The difference from the radio frequency integrated circuit 10B of the second embodiment is addition of the transmission line $TL_{50}$, but the present invention is not limited to this application.

Figure 11C:
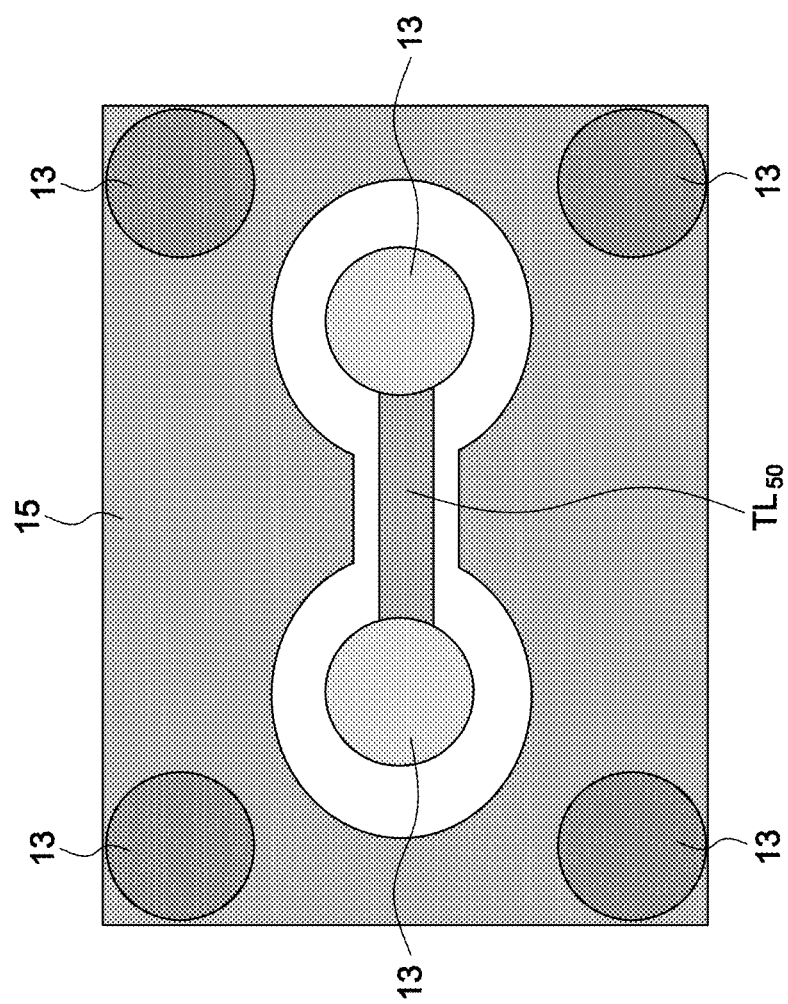
FIG. 11C is a schematic diagram in top view of another bump connecting to the transmission line of the seventh embodiment of said radio frequency integrated circuit.

Referring to FIGS. 11A-11C, which is the seventh embodiment of the radio frequency integrated circuit 10G, further includes a transmission line $TL_{50}$ which is formed on a bottom substrate 50; as FIG. 11B shows, one end of said transmission line $TL_{50}$ is terminated in an open stub OS and the other end is terminated in said bump 13, and said bump 13 is an ungrounded bump; as FIG. 11C shows, both ends of said transmission line $TL_{50}$ are connected to said bump 13, said bump 13 is an ungrounded bump, and said bumps 13 those do not connect to the said transmission line $TL_{50}$ are grounded bump, and the difference from the radio frequency integrated circuit 10E of the sixth embodiment is a difference in the formation of the transmission line $TL_{50}$, but the present invention is not limited to this application.

Figure 12:
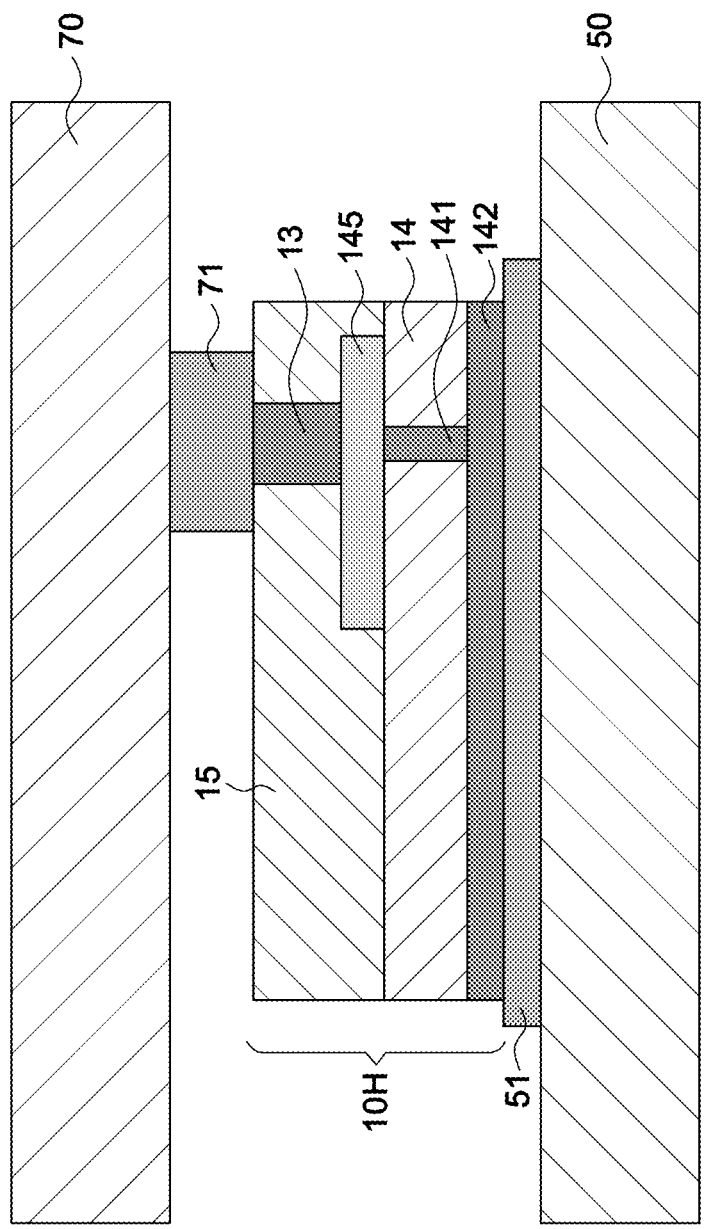
FIG. 12 is a schematic diagram of the eighth embodiment of said radio frequency integrated circuit.
Figure 13:
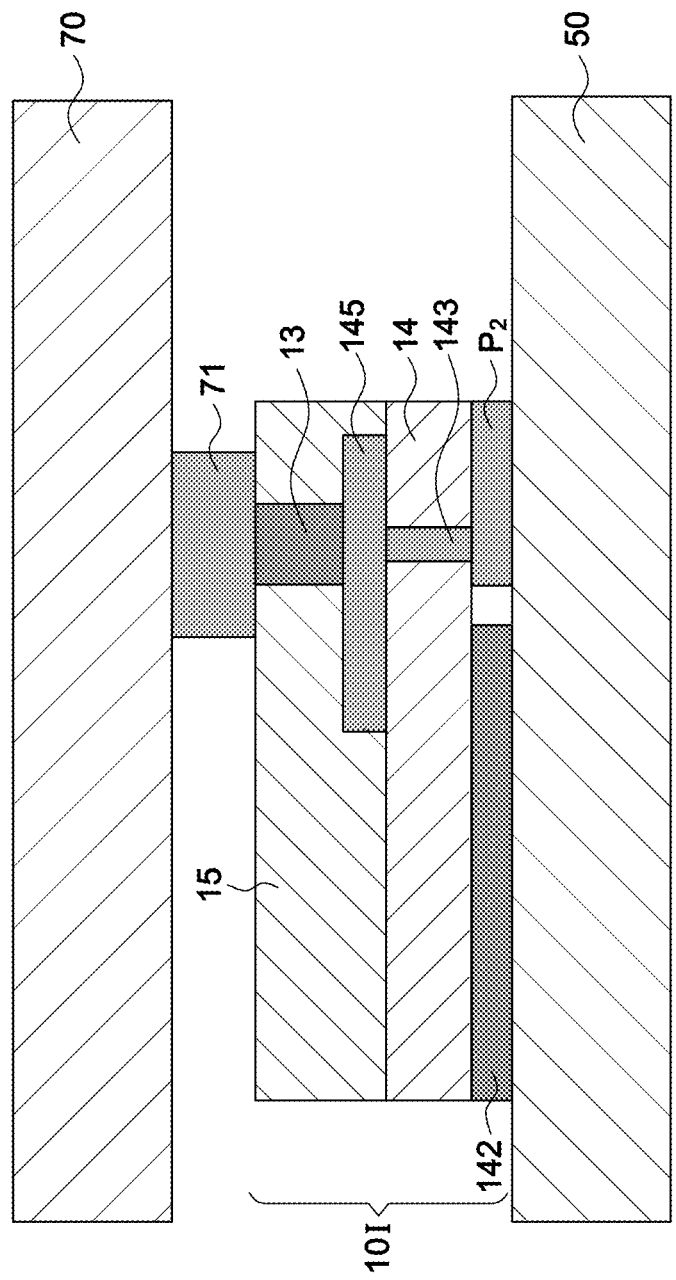
FIG. 13 is a schematic diagram of the ninth embodiment of said radio frequency integrated circuit.
Figure 14:
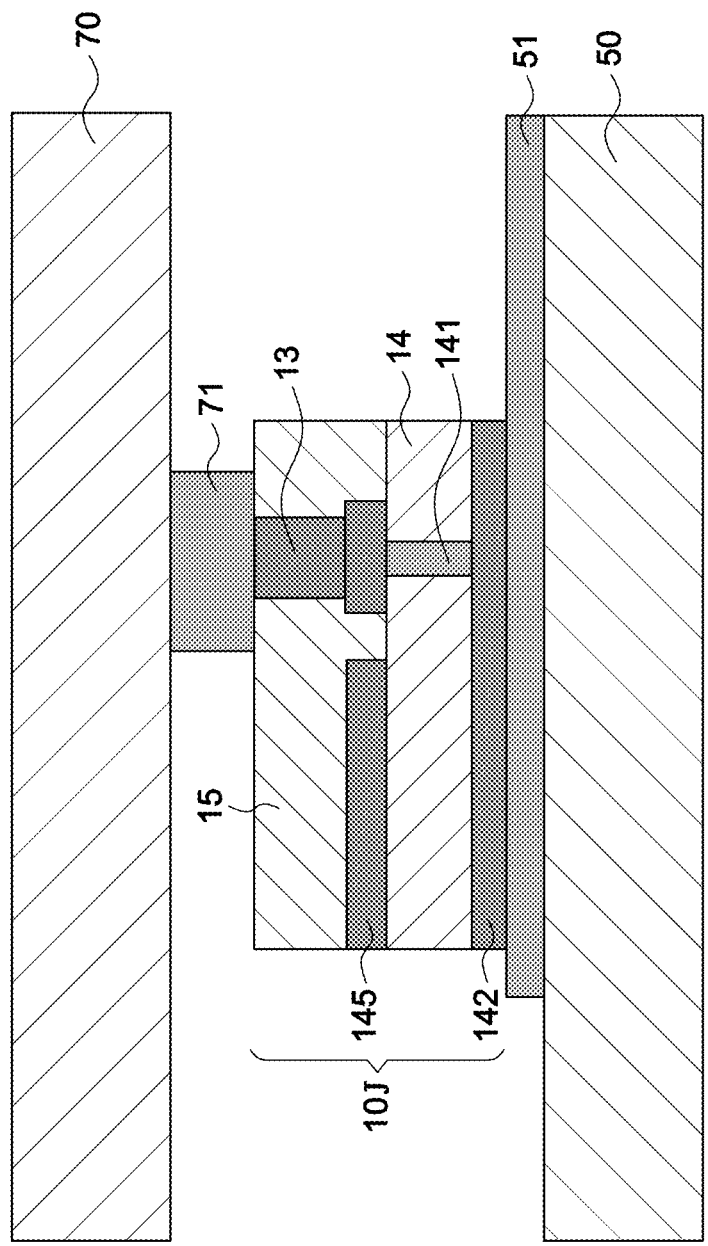
FIG. 14 is a schematic diagram of the tenth embodiment of said radio frequency integrated circuit.
Figure 15:
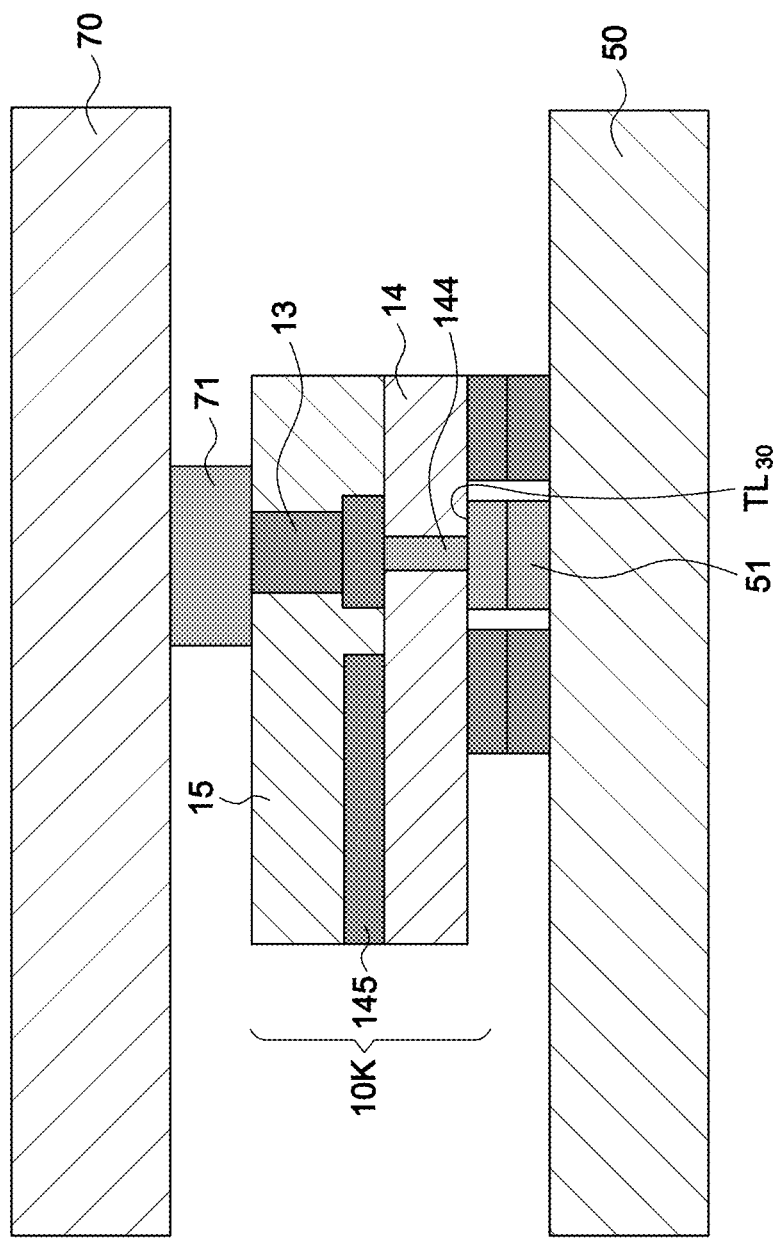
FIG. 15 is a schematic diagram of the eleventh embodiment of said radio frequency integrated circuit.

Referring to FIGS. 12~15, which is the eighth to eleventh embodiments of the radio frequency integrated circuit 10H~10K, further includes a top substrate 70, said radio frequency integrated circuit 10H~10K are stacked die connected to said bottom substrate 50 and said top substrate 70, and there is a first metal layer 51 on the bottom substrate 50 or a second metal layer 71 on the top substrate 70 to facilitate the combination of the radio frequency integrated circuit 10H~10K, and a front metal layer 145 is provided to match the front surface of the substrate 14, but the present invention is not limited to this application. Referring to FIG. 12 and FIG. 14, said substrate 14 having a substrate via 141, and the backside of said substrate 14 having a backside metal 142, so that said bottom substrate 50 is connected to said backside metal 142 through said substrate via 141, and said top substrate 70 is connected to said bump 13 and the bump is surrounded in a dielectric layer 15; Referring to FIG. 13, further includes an ungrounded via 143, and said ungrounded via 143 is connected to said substrate via 141. Referring to FIG. 15, wherein said bump 13 in series with a shunt transmission line $TL_{30}$, and said substrate 14 further having an ungrounded substrate via 144, but the present invention is not limited to this application.

Figure 16:
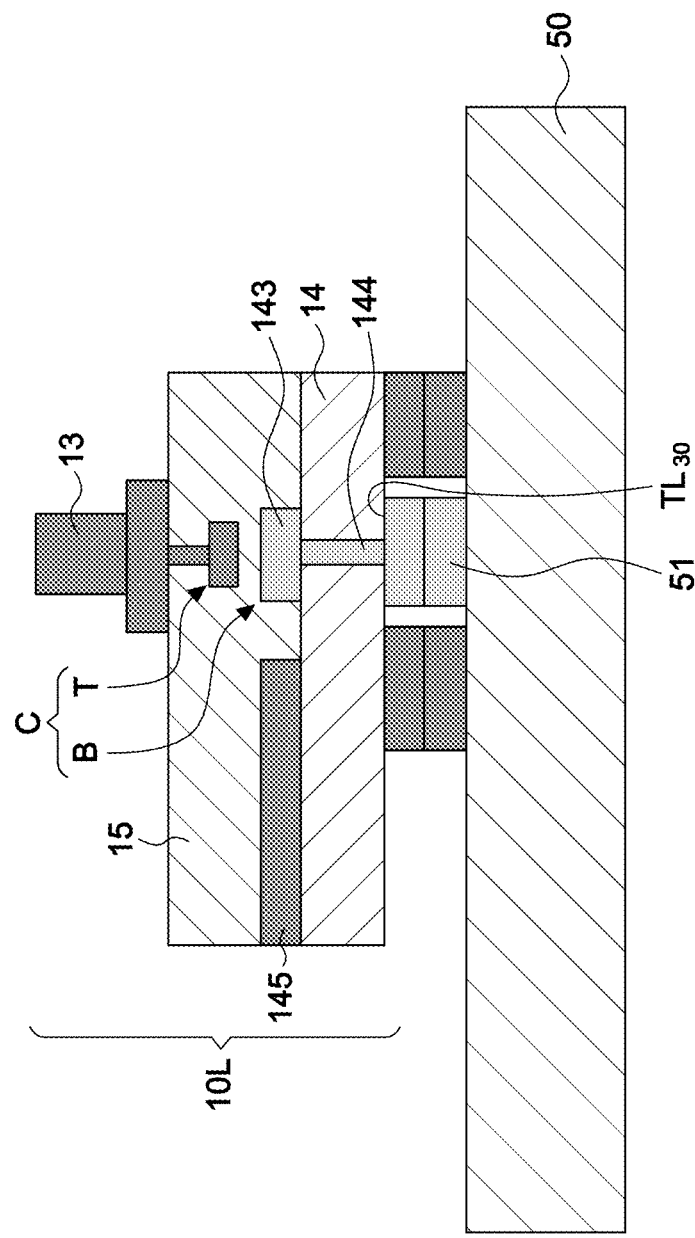
FIG. 16 is a schematic diagram of the twelfth embodiment of said radio frequency integrated circuit.
Figure 17A:
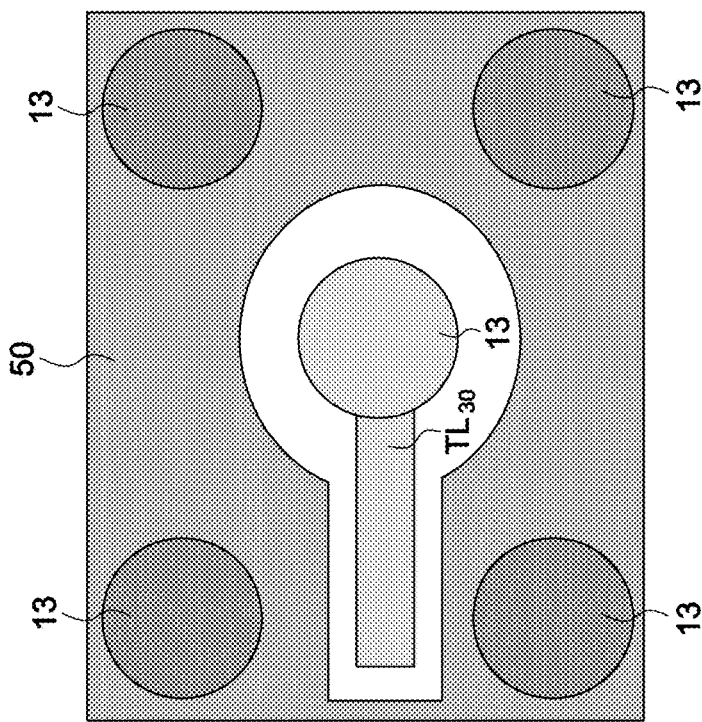
FIG. 17A is a schematic diagram of the thirteenth embodiment of said radio frequency integrated circuit.
Figure 17B:
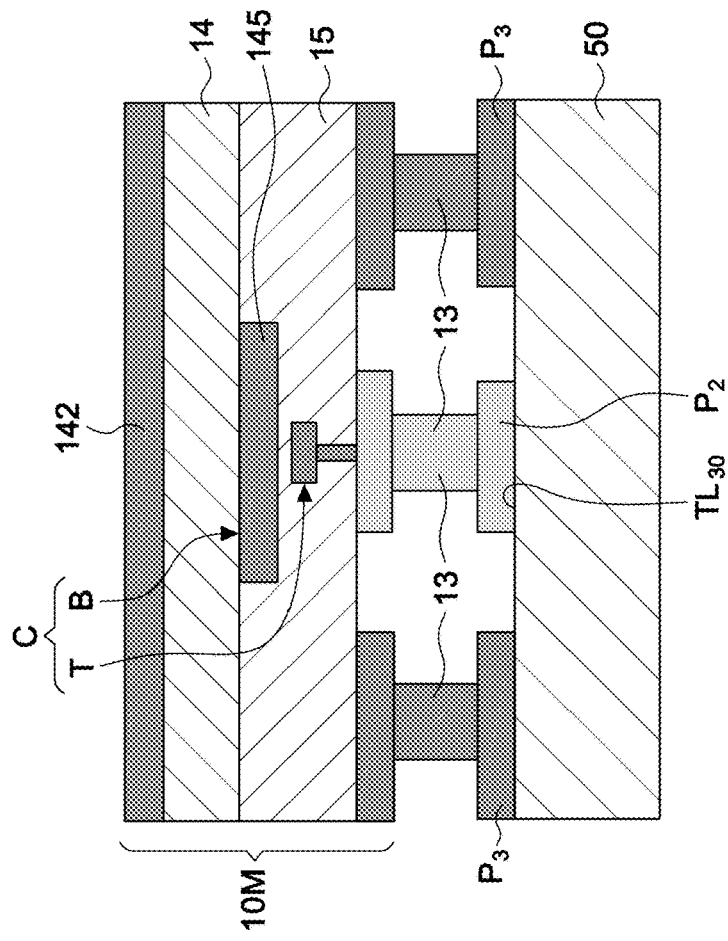
FIG. 17B is a schematic diagram in top view of the bump connecting to the transmission line of the thirteenth embodiment of said radio frequency integrated circuit.

Referring to FIG. 16, FIG. 17A and FIG. 17B, which is the twelfth to thirteenth embodiments of the radio frequency integrated circuit 10L~10M, said bump 13, said shunt transmission line $TL_{30}$, said ungrounded substrate via 144, or a combination thereof, can be connected together with a capacitor C in series to form a shunt L-C resonator LC, said shunt L-C resonator LC in conjunction with the parasitic output capacitance $L_D$ of said transistor 11 with different compensation networks 12, works as a harmonic matching network for switch mode power amplifiers; Therefore, the shunt L-C resonator LC and the parasitic output capacitance $L_D$ of the transistor 11 are combined to form a different compensation network, in this embodiment, said shunt L-C resonator LC is formed in part or fully by using a metal-insulator-metal capacitor as said capacitor C on an ungrounded via 143 or said ungrounded substrate via 144. Referring to FIG. 17B, said shunt L-C resonator LC can be formed partly or fully by using an open stub transmission line OS as said capacitor C with said shunt transmission line $TL_{30}$, said bump 13, which is surrounded in a dielectric layer 15, or said ungrounded substrate via 144 acting as an inductor, but the present invention is not limited to this application.

Figure 18:
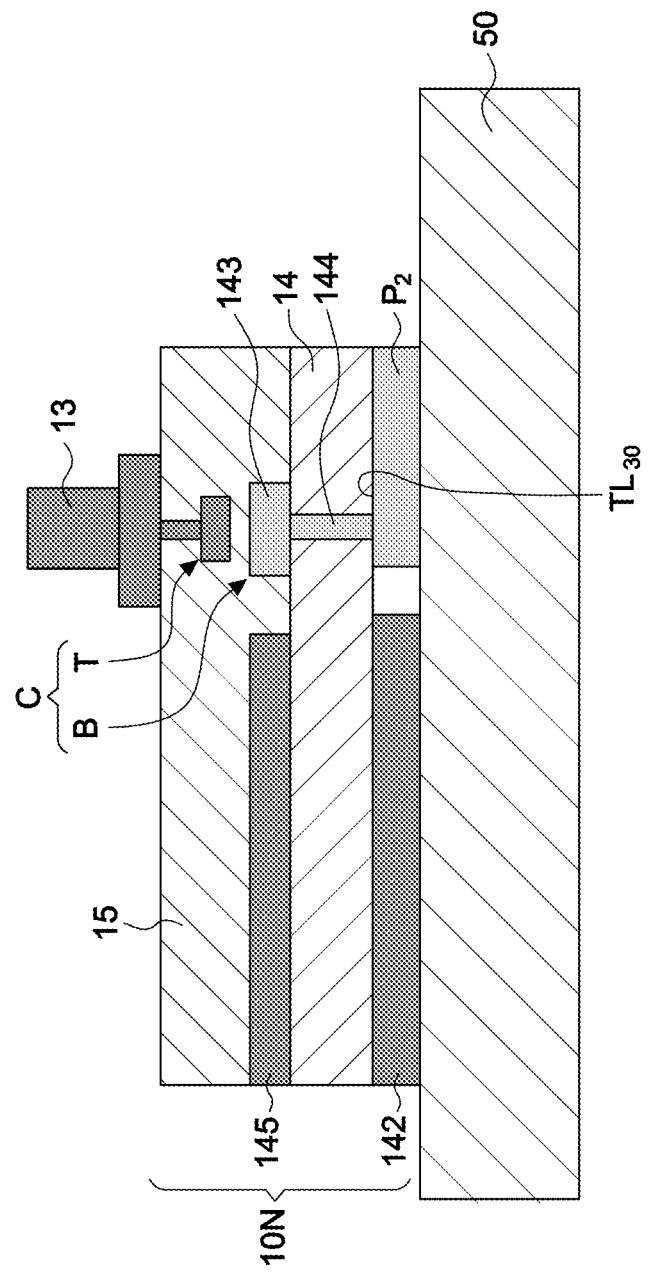
FIG. 18 is a schematic diagram of the fourteenth embodiment of said radio frequency integrated circuit.

Referring to FIG. 18, which is the fourteenth embodiment of the radio frequency integrated circuit 10N, said metal-insulator-metal capacitor and an ungrounded via 143 or said ungrounded substrate via 144 have a dielectric layer 15, in this embodiment, said dielectric layer 15 may form the backside metal of said substrate 14 connection to said ungrounded via 143 or said ungrounded substrate via 144 and the bottom plate B of said metal-insulator-metal capacitor, but the present invention is not limited to this application.

Moreover, said shunt L-C resonator LC can be formed in part or fully by using a voltage-tunable variable capacitor as said capacitor C and said capacitor C dielectric material is formed in part or fully by Barium Strontium Titanate, Tantalum Pentoxide, Hafnium Oxide, Aluminum Oxide, or a combination thereof; or said capacitance of said shunt L-C resonator LC can be formed in part or fully by using a bond pad as a metal-insulator-metal capacitor or under bump, said bond pad and said bump 13 have a dielectric layer 15, wherein said dielectric layer 15 may form an under bump metal of said bump 13 and the top plate T of said metal-insulator-metal capacitor, said metal-insulator-metal capacitance can be formed by a parallel plate capacitor, an inter-digitated capacitor, a metal cross-over, or a combination thereof, but the present invention is not limited to this application.

Figure 19:
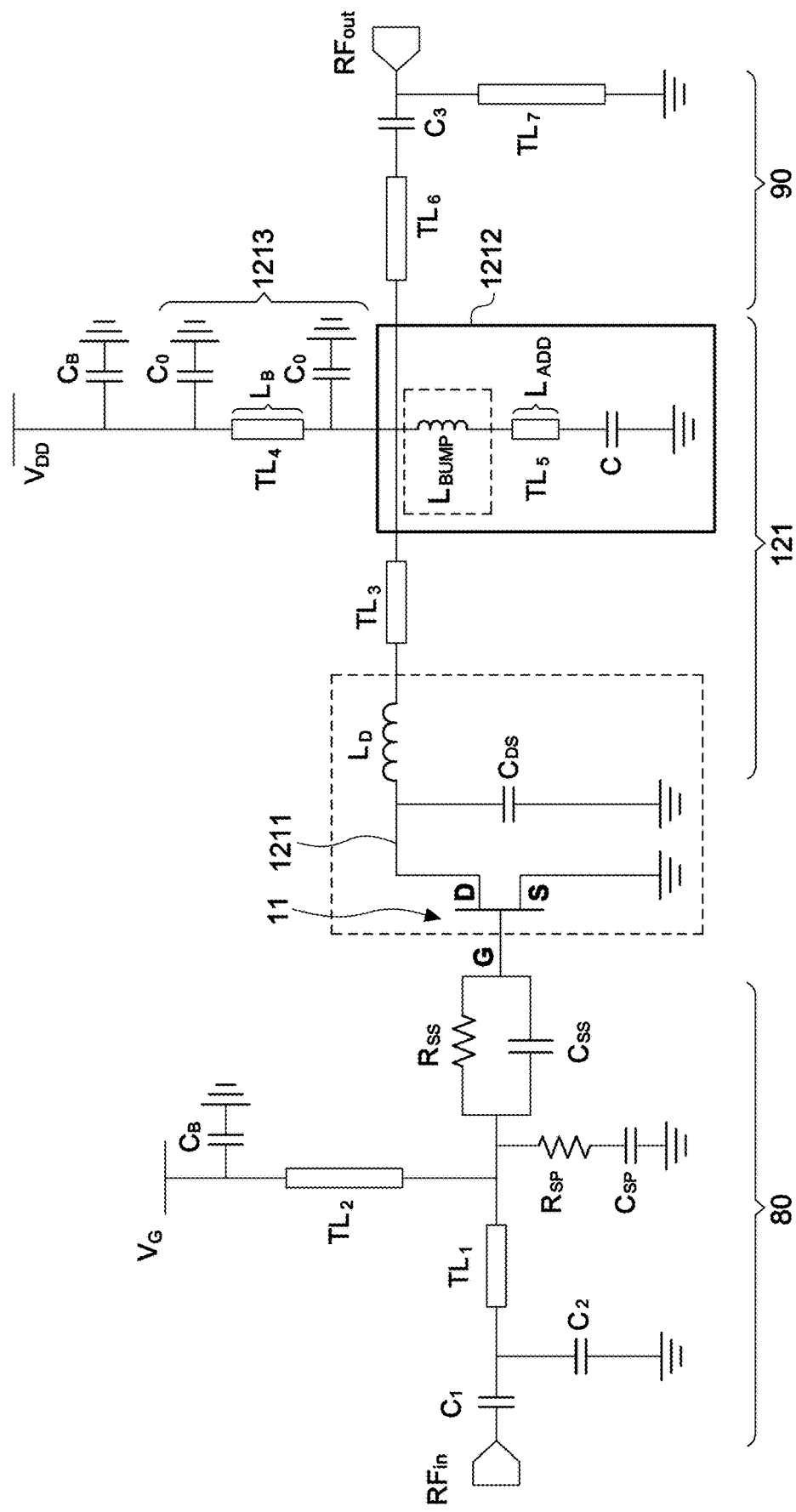
FIG. 19 is a schematic diagram of said radio frequency matching circuit.
Figure 20A:
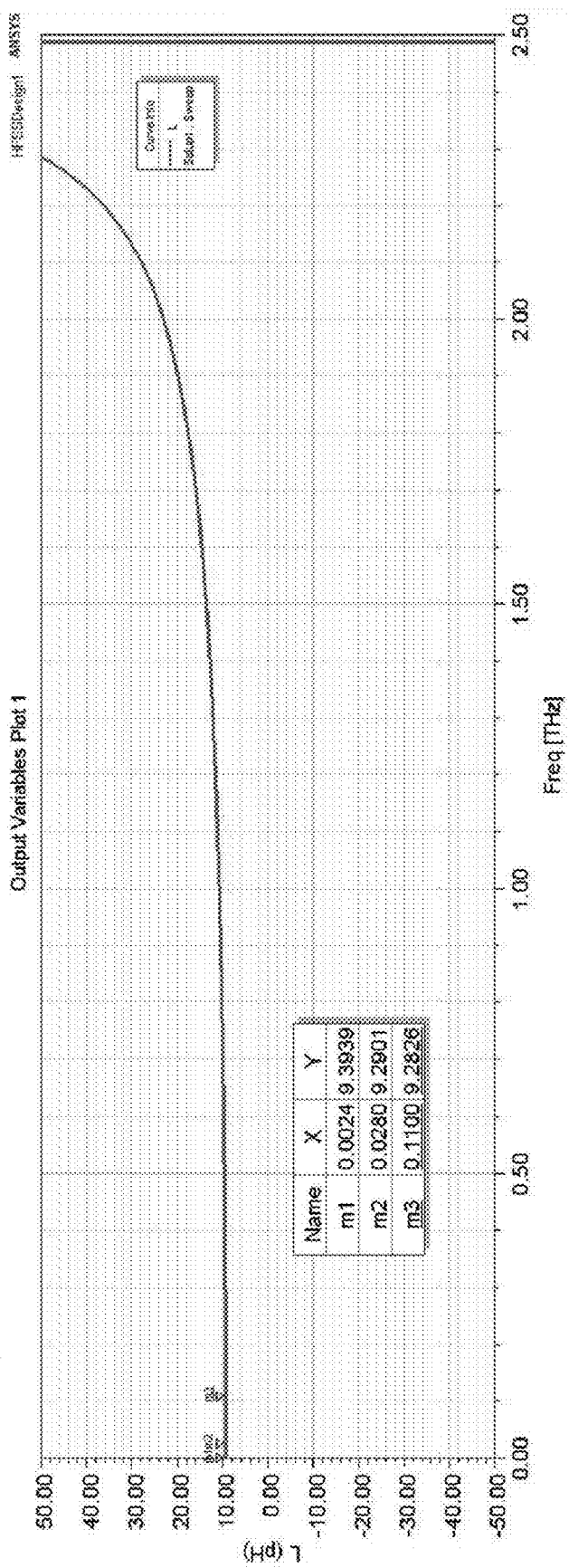
FIG. 20A is a simulated diagram of the inductance versus frequency of a 30 μm high bump of the present invention.
Figure 20B:
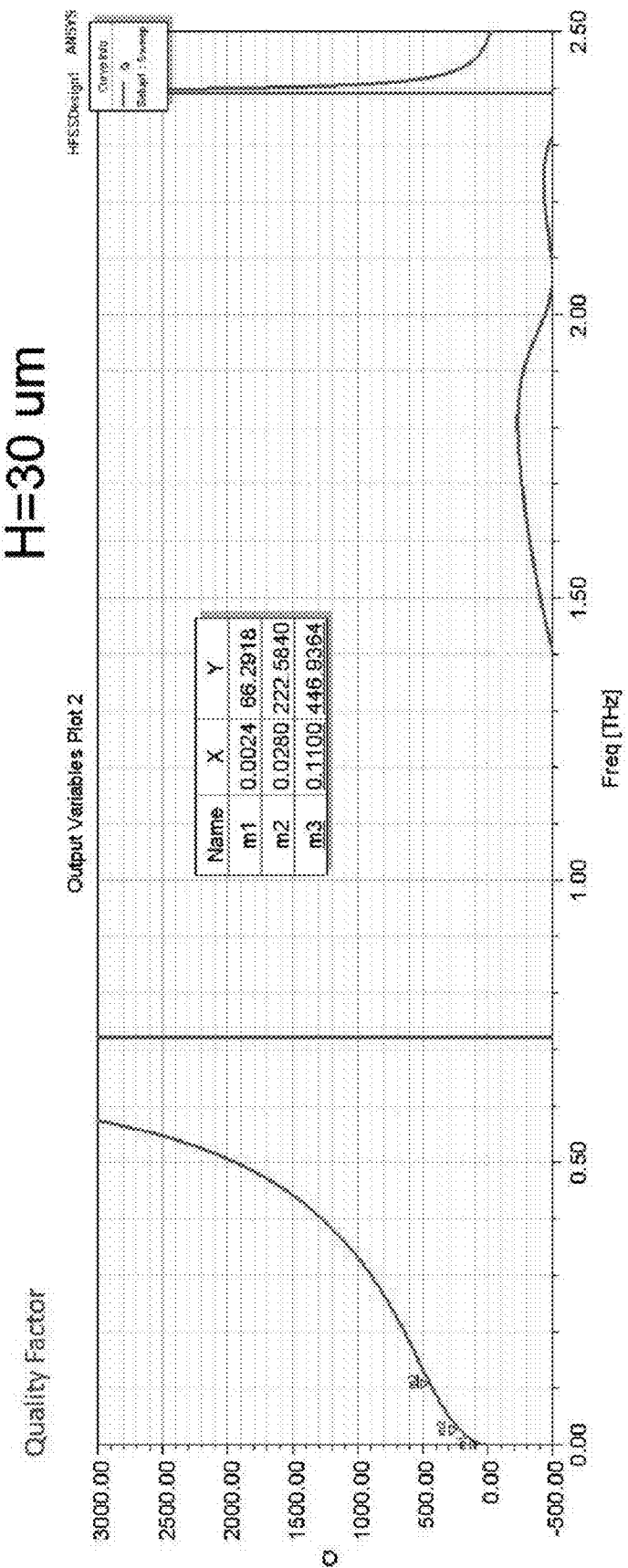
FIG. 20B is a simulated diagram of the quality factor versus frequency of a 30 μm high bump of the present invention.
Figure 20C:
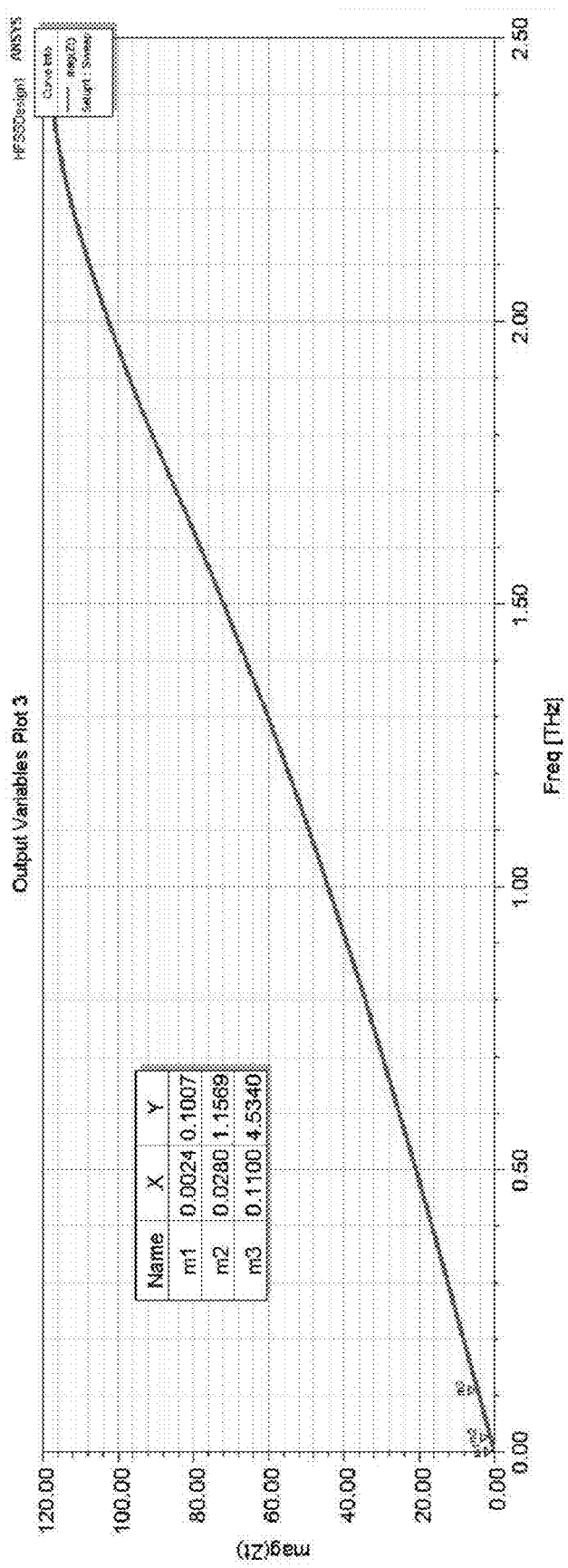
FIG. 20C is a simulated diagram of the resistance versus frequency of a 30 μm high bump of the present invention.
Figure 20D:
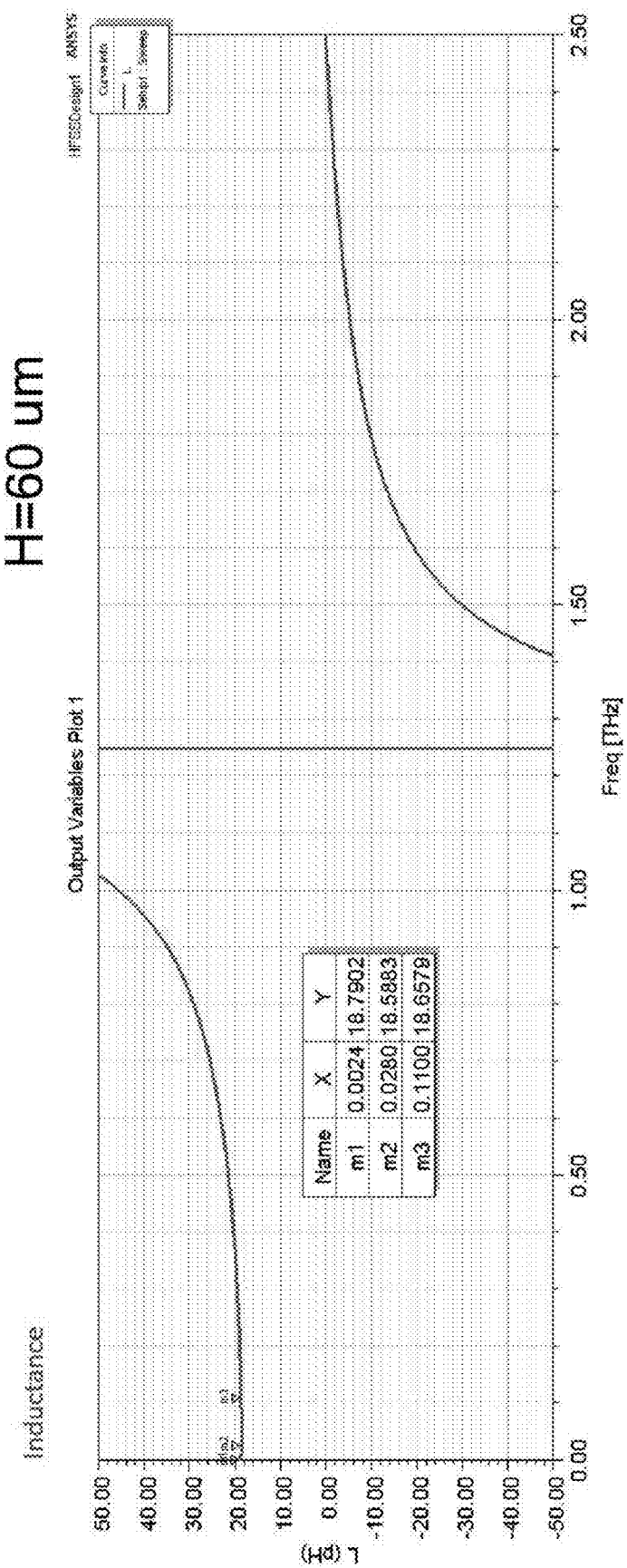
FIG. 20D is a simulated diagram of the inductance versus frequency of a 60 μm high bump of the present invention.
Figure 20E:
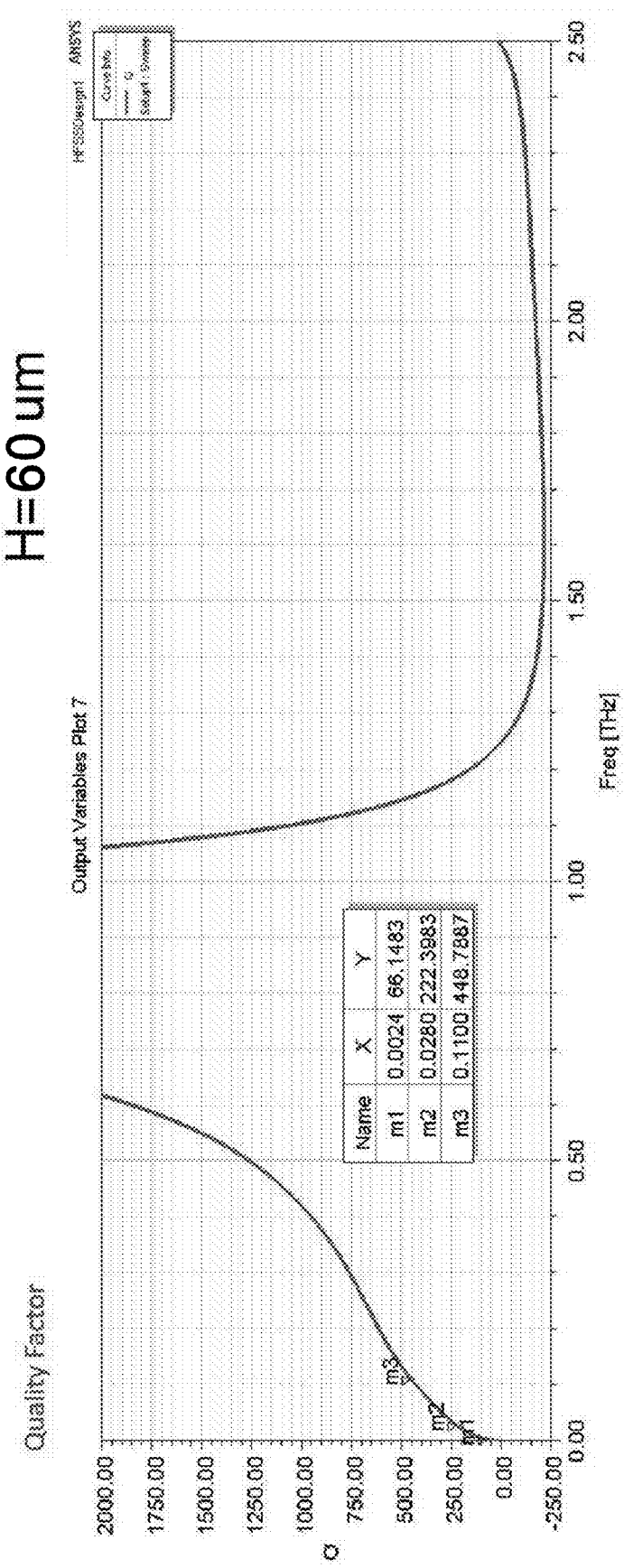
FIG. 20E is a simulated diagram of the quality factor versus frequency of a 60 μm high bump of the present invention.
Figure 20F:
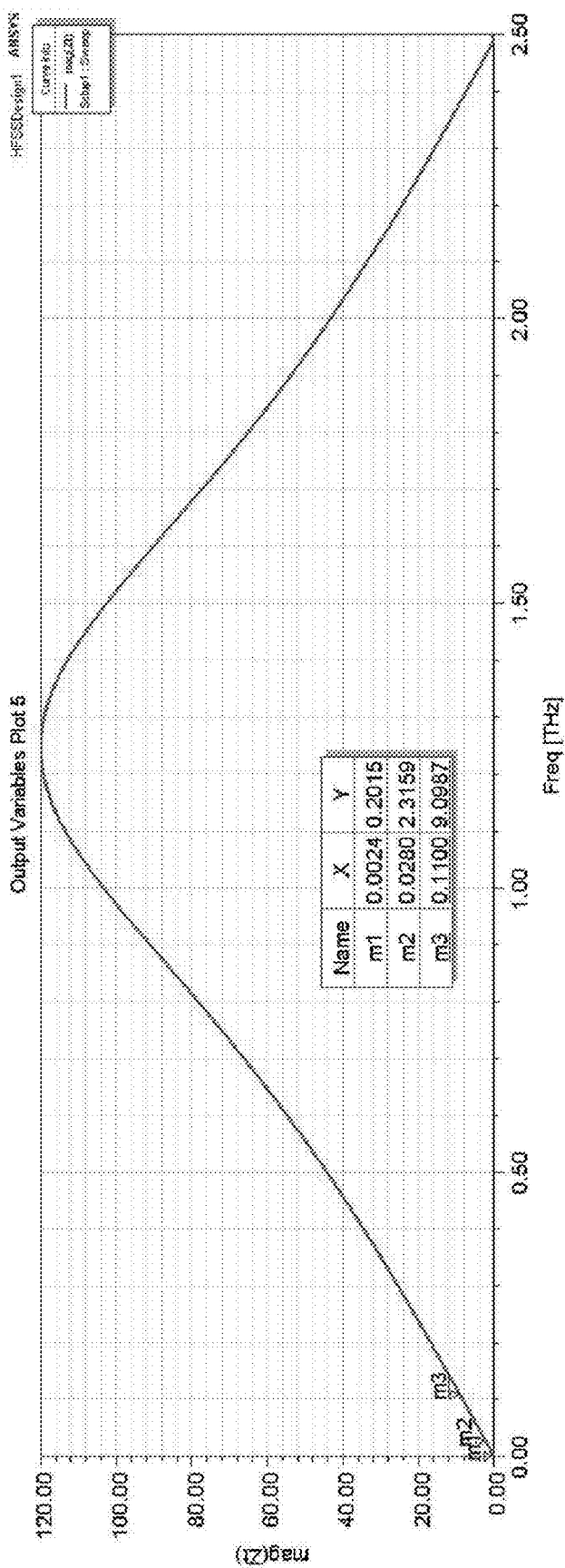
FIG. 20F is a simulated diagram of the resistance versus frequency of a 60 μm high bump of the present invention.

Moreover, wherein said shunt L-C resonator LC could be part of any switch-mode power amplifiers like class C, E, F, inverse F or S amplifiers or could be used in any linear amplifiers like class A, AB, B or C amplifiers. As FIG. 19 shows, said harmonic matching network 121 for class F topology is comprised of said shunt L-C harmonic terminating network, a shunt compensating network 1213 composed of a shunt inductor $L_B$ and a shunt capacitor $C_o$ of lumped low-pass π-type shunt quarter-wave transmission line and the device output parasitic capacitance, using the second and third harmonic frequencies of the fundamental frequency. The values of the inductance L and capacitance C for class F harmonic matching network using second and third harmonics can be calculated using equations in Formula 1~Formula 4:

$$C = \frac{1}{4L_{total}\omega_0^2} \quad \text{(Formula 1)}$$

$$L = \frac{9L_B}{45L_B[C_{DS} + C_0]\omega_0^2 - 5} \quad \text{(Formula 2)}$$

$$L = L_{BUMP} + L_{ADD} \quad \text{(Formula 3)}$$

$$L_B = \frac{Z_0}{\omega_0}; C_0 = \frac{1}{Z_0\omega_0^1} \quad \text{(Formula 4)}$$

where, $L_{BUMP}$ is the inductance of the bump,

L and C are the inductance and capacitance of the shunt L-C resonator, $L_{ADD}$ is the extra inductance as per need basis for required inductance L and can be formed from the ungrounded substrate via or shunt transmission line or various combinations thereof, $w_o$ is the RF fundamental angular frequency, $L_B$ and $C_O$ are the shunt inductance and shunt capacitance of the compensating network, $Z_0$ is the characteristic impedance of the shunt low-pass π-type quarter wave transmission line acting as compensating network, $C_{DS}$ is the device parasitic output capacitance, used for second and third harmonics.

Furthermore, said harmonic matching circuits 121 is coupled to an input matching network 80 and a fundamental output matching network 90, but the present invention is not limited to this application.

With the feature disclosed above, as shown in FIGS. 20A~20F, the bump $L_B$ has the advantage of high quality factor and self-resonance frequency, making the bump $L_B$ an excellent choice for the design of an amplifier with an harmonic matching network, and the amplifier includes low noise amplifiers, power amplifiers, hybrid integrated circuits or monolithic integrated circuits, etc., that use the bumps as passive components for amplifier impedance matching, which not only solves the power loss problem, but also provides the best low inductance required by the harmonic matching network (typically 40-50 pH).

Although particular embodiments of the invention have been described in detail for purposes of illustration, various modifications and enhancements may be made without departing from the spirit and scope of the invention. Accordingly, the invention is not to be limited except as by the appended claims

What is claimed is:

1. A radio frequency integrated circuit comprising:
   at least one transistor;
   a matching circuit coupled to said transistor; and
   at least one bump is used to form a passive element in said matching circuit, and said bump is used for radio frequency matching.

2. The radio frequency integrated circuit as claimed in claim 1, wherein said radio frequency matching is input harmonic matching, output harmonic matching, input fundamental matching, output fundamental matching, or a combination thereof.

3. The radio frequency integrated circuit as claimed in claim 2, wherein said harmonic matching circuit matches the impedance of the transistor at least one harmonic frequency from second harmonic frequency to higher order harmonic frequencies, or a combination thereof.

4. The radio frequency integrated circuit as claimed in claim 3, wherein said harmonic matching circuits includes a harmonic terminating network composed of a shunt L-C network where inductor and capacitance are in series, and said inductor includes inductance of said bump.

5. The radio frequency integrated circuit as claimed in claim 4, further includes a substrate, said substrate is connected to said matching circuit by said bump.

6. The radio frequency integrated circuit as claimed in claim 5, wherein said capacitance of said L-C network of claim 5 is formed partly or entirely on said substrate.

7. The radio frequency integrated circuit as claimed in claim 5, wherein said substrate is a printed circuit board, laminate, interposer, or a combination thereof.

8. The radio frequency integrated circuit as claimed in claim 1, wherein said radio frequency integrated circuit is a monolithic microwave integrated circuit, hybrid integrated circuit, or a combination thereof.

9. The radio frequency integrated circuit as claimed in claim 1, wherein said bump is composed of an eutectic combination of materials, lead free materials, high lead materials, solder materials, copper-containing materials, or combination thereof.

10. The radio frequency integrated circuit as claimed in claim 1, wherein said bump may be a pillar.

11. The radio frequency integrated circuit as claimed in claim 1, further includes a conductor, said conductor is arranged at a predetermined position of said radio frequency integrated circuit, so that said conductor and said bump are used together.

12. The radio frequency integrated circuit as claimed in claim 11, wherein said conductor is a wire bond or wedge bond.

13. The radio frequency integrated circuit as claimed in claim 11, further includes a substrate, said substrate is connected to said bump, and said substrate is a printed circuit board, laminate, interposer, or a combination thereof.

14. The radio frequency integrated circuit as claimed in claim 1, further includes a redistribution layer, and said bump is connected to said matching circuit through said redistribution layer.

15. The radio frequency integrated circuit as claimed in claim 14, further includes an antenna and a bottom substrate, and said antenna is arranged on said bottom substrate, and said radio frequency integrated circuit is arranged on said bottom substrate, so that said radio frequency integrated circuit is connected to said antenna.

16. The radio frequency integrated circuit as claimed in claim 15, wherein said bottom substrate upon which said antenna is arranged is Silicon, Silicon-on-insulator, ceramic, glass, laminate, printed circuit board, interposer, or combination thereof.

17. The radio frequency integrated circuit as claimed in claim 16, wherein said radio frequency integrated circuit and said antenna together form an antenna-in-package product.

18. The radio frequency integrated circuit as claimed in claim 1, wherein said radio frequency integrated circuit has an operating frequency range between 3 GHz to 300 GHz.

19. The radio frequency integrated circuit as claimed in claim 1, further includes a transmission line, said transmission line being connected to said bump.

20. The radio frequency integrated circuit as claimed in claim 19, wherein said transmission line is a coplanar waveguide, a grounded coplanar waveguide, microstrip line, a stripline, or a combination thereof.

21. The radio frequency integrated circuit as claimed in claim 1, further includes a transmission line and is formed on a bottom substrate.

22. The radio frequency integrated circuit as claimed in claim 1, further includes a substrate and a transmission line, and said transmission line is terminated in an open stub or ungrounded bump.

23. The radio frequency integrated circuit as claimed in claim 1, further includes a top and bottom substrate, and said substrate having a substrate via, and the backside of said substrate having a backside metal, so that said bottom substrate is connected to said backside metal through said substrate via, and said top substrate is connected to said bump.

24. The radio frequency integrated circuit as claimed in claim 23, wherein said radio frequency integrated circuit is a stacked die connected to said bottom substrate and said top substrate.

25. The radio frequency integrated circuit as claimed in claim 23, further includes an ungrounded via, and said ungrounded via is connected to said substrate via.

26. The radio frequency integrated circuit as claimed in claim 1, wherein said bump is in series with a shunt transmission line.

27. The radio frequency integrated circuit as claimed in claim 26, further includes a substrate, said substrate having an ungrounded substrate via.

28. The radio frequency integrated circuit as claimed in claim 27, further includes an antenna and a bottom substrate, said bottom substrate upon which said antenna is arranged is Silicon, Silicon-on-insulator, ceramic, glass, laminate, printed circuit board, interposer, or combination thereof.

29. The radio frequency integrated circuit as claimed in claim 27, wherein said bump, said shunt transmission line, said ungrounded substrate via, or a combination thereof, can be connected together with a capacitor in series to form a shunt L-C resonator, said shunt L-C resonator in conjunction with the parasitic output capacitance of said transistor with different compensation networks working as a harmonic matching network for switch mode power amplifiers.

30. The radio frequency integrated circuit as claimed in claim 29, wherein said shunt L-C resonator branch can be connected to the input of the transistor for input harmonic termination, the output of the transistor for output harmonic terminations, or a combination thereof, for linear power amplifiers.

31. The radio frequency integrated circuit as claimed in claim 29, wherein said shunt L-C resonator is formed in part or fully by using a metal-insulator-metal capacitor as said capacitor on an ungrounded via or said ungrounded substrate via.

32. The radio frequency integrated circuit as claimed in claim 31, wherein said metal-insulator-metal capacitor and an ungrounded via or said ungrounded substrate via have a common metal layer.

33. The radio frequency integrated circuit as claimed in claim 32, wherein said common metal layer may form the backside metal of said substrate connection to said ungrounded via or said ungrounded substrate via and the bottom plate of said metal-insulator-metal capacitor.

34. The radio frequency integrated circuit as claimed in claim 31, wherein said metal-insulator-metal capacitance can be formed by a parallel plate capacitor, an interdigitated capacitor, a metal cross-over, or a combination thereof.

35. The radio frequency integrated circuit as claimed in claim 29, wherein said shunt L-C resonator can be formed partly or fully by using an open stub transmission line as said capacitor with said shunt transmission line, said bump or said ungrounded substrate via acting as an inductor.

36. The radio frequency integrated circuit as claimed in claim 29, wherein said shunt L-C resonator can be formed in part or fully by using a voltage-tunable variable capacitor, a static capacitor, or a combination thereof.

37. The radio frequency integrated circuit as claimed in claim 29, wherein said capacitance of said shunt L-C resonator can be formed in part or fully by using a bond pad as a metal-insulator-metal capacitor or under bump, said bond pad and said bump have a common metal layer.

38. The radio frequency integrated circuit as claimed in claim 37, wherein said common metal layer may form an under bump metal of said bump and the top plate of said metal-insulator-metal capacitor.

39. The radio frequency integrated circuit as claimed in claim 29, wherein said shunt L-C resonator could be part of any switch-mode power amplifiers like class C, E, F, inverse F or S amplifiers or could be used in any linear amplifiers like class A, AB, B or C amplifiers.

40. The radio frequency integrated circuit as claimed in claim 29, wherein said harmonic matching network for class F topology comprises of said shunt L-C harmonic terminating network, a shunt compensating network composed of a shunt inductor and a shunt capacitor of lumped low-pass x-type shunt quarter-wave transmission line and device output parasitic capacitance, using the second and third harmonic frequencies of the fundamental frequency.

41. The radio frequency integrated circuit as claimed in claim 1, wherein said bump can be a single bump or multiple bumps connected in parallel.

42. The radio frequency integrated circuit as claimed in claim 1, wherein said bump is a solder bump, a micro-bump, a hybrid bump, flip-chip bump, or combination thereof.

\* \* \* \* \*